(12) United States Patent
Malkin

(10) Patent No.: US 9,025,711 B2
(45) Date of Patent: May 5, 2015

(54) FAST FILTERING FOR A TRANSCEIVER

(71) Applicant: Applied Micro Circuits Corporation, Sunnyvale, CA (US)

(72) Inventor: Moshe Malkin, Palo Alto, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 13/965,375

(22) Filed: Aug. 13, 2013

(65) Prior Publication Data
US 2015/0049847 A1 Feb. 19, 2015

(51) Int. Cl.
| | | |
|---|---|---|
| H04B 1/10 | (2006.01) | |
| H04L 27/06 | (2006.01) | |
| G06F 17/15 | (2006.01) | |
| H04B 1/12 | (2006.01) | |
| H04B 1/38 | (2006.01) | |

(52) U.S. Cl.
CPC . *H04B 1/123* (2013.01); *H04B 1/38* (2013.01)

(58) Field of Classification Search
CPC .. H04B 1/1018; H04B 1/1036; H04B 1/1081; H04B 1/123; H04B 1/7101; H04B 1/7102; H04B 2001/70935
USPC ......... 375/144, 148, 150, 152, 219, 232, 260, 375/343, 346, 349, 350; 708/303, 308, 309, 708/322, 323, 401, 424
See application file for complete search history.

(56) References Cited

U.S. PATENT DOCUMENTS

| | | | | |
|---|---|---|---|---|
| 5,357,257 | A | * | 10/1994 | Nevin ........................... 342/165 |
| 6,952,460 | B1 | * | 10/2005 | Van Wechel et al. ......... 375/350 |
| 8,401,497 | B2 | | 3/2013 | Rofougaran |
| 8,406,175 | B2 | | 3/2013 | Santivanez et al. |
| 8,472,506 | B2 | | 6/2013 | Kent et al. |
| 2002/0064291 | A1 | * | 5/2002 | Kates et al. ................... 381/318 |
| 2003/0031242 | A1 | * | 2/2003 | Awad et al. ................... 375/232 |
| 2006/0002547 | A1 | * | 1/2006 | Stokes et al. ............. 379/406.14 |
| 2011/0096942 | A1 | * | 4/2011 | Thyssen ....................... 381/94.1 |

* cited by examiner

*Primary Examiner* — Young T. Tse
(74) *Attorney, Agent, or Firm* — Amin, Turocy & Watson, LLP

(57) ABSTRACT

Techniques for fast filtering for a transceiver are presented. A multidimensional filter processor component (MDFPC) can perform configurations and adaptations of multiple digital filters of a transceiver. The MDFPC can treat multiple, separate filters of a transceiver as a single larger multidimensional filter, and jointly update the multiple filters in a single adaptation operation instead of performing multiple adaptation operations on multiple filters. To facilitate multidimensional filter adaptation, the MDFPC can manage respective cross-correlations associated with the inputs of the filters. The MDFPC can facilitate multidimensional filter adaptation by performing multidimensional filter adaptation in the frequency domain, wherein the adaptation can be performed in parallel for multiple frequency sub-channels. For each frequency sub-channel, the MDFPC can perform a filter adaptation, wherein respective filter adaptation matrices can be generated for respective frequency sub-channels to perform the update to facilitate managing different cross-correlations associated with different frequency sub-channels.

34 Claims, 9 Drawing Sheets

FAST FILTERING FOR A TRANSCEIVER

TECHNICAL FIELD

The subject disclosure relates generally to communication of information, and more particularly to fast filtering for transceivers.

BACKGROUND

To facilitate communication of data traffic, data traffic can be filtered (e.g., to reduce unwanted signal noise) by transceivers. In some instances, adaptive filters can be employed to facilitate adaptively filtering data traffic (e.g., to facilitate more accurately filtering out unwanted signal noise while enabling desirable presentation or communication of the desired signal).

Conventionally, with multiple digital filters having to be converged in a transceiver system, for proper link operation, each of the digital filters is effectively converged individually. Since the inputs (e.g., data being inputted) to the digital filters are correlated, these correlations can result in the individual filter adaptations being undesirably slow and inefficient. This can result in an undesirable (e.g., sub-optimal) filter convergence performance and can lead to the system having an undesirably long startup time, an undesirably slow reaction time, and undesirable performance issues.

The above-described description is merely intended to provide a contextual overview of current systems associated with transceivers and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, disclosed is a system that comprises a first filter component and a second filter component for filtering signals associated with a communication component. The system further comprises a filter processor component for determining a cross-coupled correlation structure associated with a cross-correlation between respective inputs of the first filter component and the second filter component, and for determining an inverse cross-coupled correlation structure that corresponds to the inverse of the cross-coupled correlation structure to facilitate joint adaptation of the first filter component and the second filter component.

In another example embodiment, disclosed is a method that comprises determining a cross-coupled correlation structure associated with a cross-correlation between respective inputs of a first filter and a second filter associated with a communication device. The method further comprises determining an inverse correlation structure that corresponding to the inverse of the cross-coupled correlation structure to facilitate jointly adapting the first filter and the second filter based at least in part on the inverse correlation structure.

In yet another example embodiment, disclosed is a system that comprises means for determining an inverse cross-coupled correlation between respective inputs of a first means for filtering and a second means for filtering associated with a transceiver component based at least in part on conditions associated with the first means for filtering and the second means for filtering. The system further comprises means for determining an inverse cross-coupled correlation structure, based on the inverse cross-coupled correlation between the respective inputs of the first means for filtering and the second means for filtering, to facilitate jointly adapting the first means for filtering and the second means for filtering using the inverse cross-coupled correlation structure.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
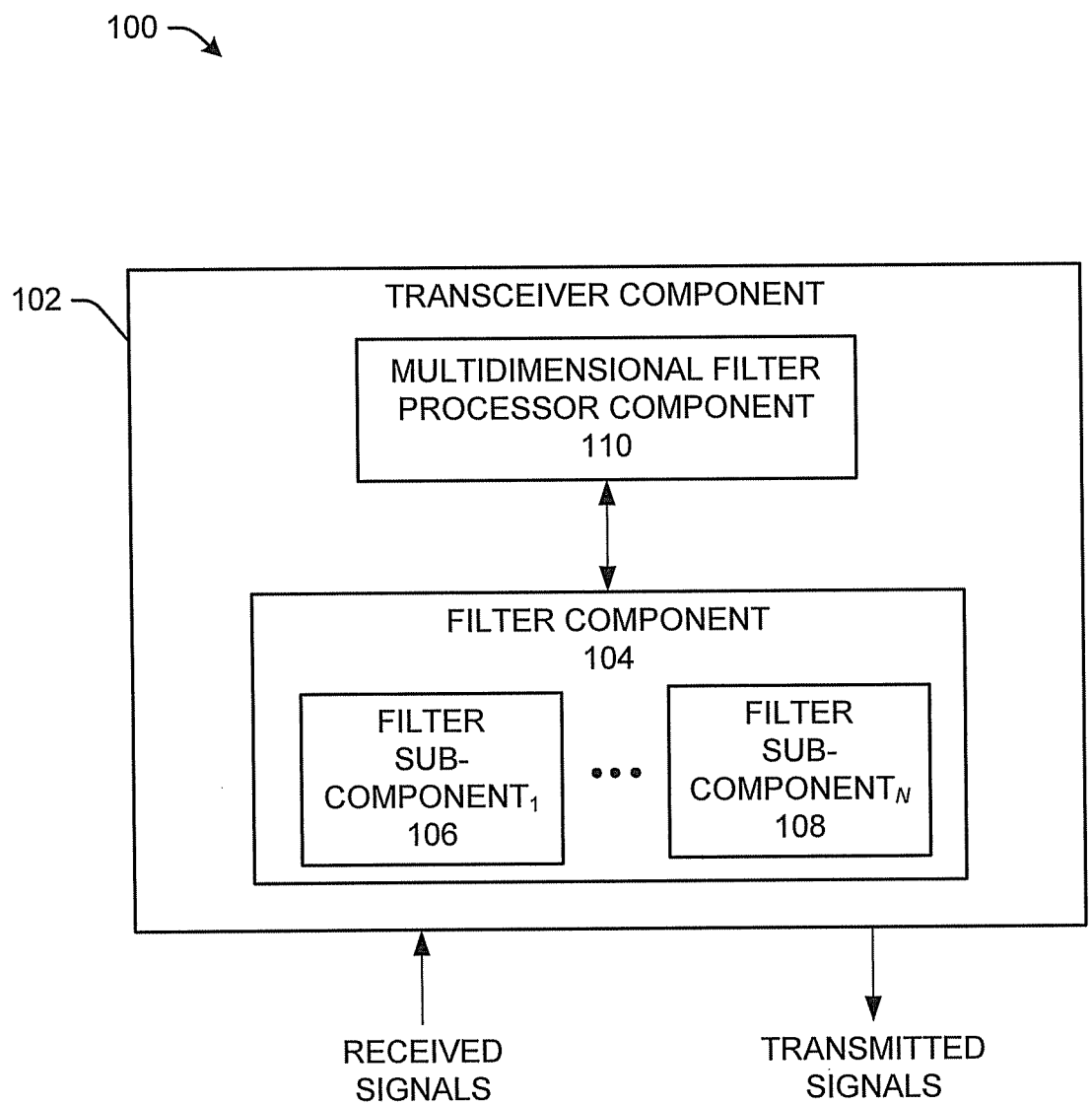
FIG. 1 illustrates a block diagram of an example, non-limiting system that can facilitate managing configuration and adaptation of filters associated with a transceiver component, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Techniques for desirably fast and efficient filtering for a transceiver component are presented. A multidimensional filter processor component can facilitate efficiently performing configurations and adaptations of multiple digital filters associated with a transceiver component. The multidimensional filter processor component can treat and manage multiple, separate filters of a transceiver component as a single larger multidimensional filter, and can jointly update (e.g., update combinationally and/or at the same time) the multiple filters in a single adaptation operation instead of performing multiple adaptation operations on multiple filters. To facilitate multidimensional filter adaptation, the multidimensional filter processor component can manage the respective cross-correlations associated with the inputs of the filters. In some implementations, the multidimensional filter processor component can facilitate multidimensional filter adaptation by performing multidimensional filter adaptation in the frequency domain, wherein multidimensional filter processor component can perform such adaptation in parallel for multiple (e.g., many) frequency sub-channels (e.g., frequency-domain sub-channels). For each frequency sub-channel, the multidimensional filter processor component can perform an adaptation (e.g., an augmented multiple input, multiple output (MIMO) least mean square (LMS) adaptation (e.g., a cross-coupled MIMO LMS adaptation)), wherein the multidimensional filter processor component can generate a respective update matrix (or matrices) (e.g., a respective MIMO LMS update matrix (or matrices)) for each frequency sub-channel to facilitate performing the update on the filters to facilitate managing different cross-correlations associated with different frequency sub-channels of the filters.

FIG. 1 illustrates a block diagram of an example, non-limiting system 100 that can facilitate managing configuration and adaptation of filters associated with a transceiver component, in accordance with various aspects and embodiments of the disclosed subject matter. The system 100 can comprise a transceiver component 102 that can be employed to communicate traffic (e.g., voice or data traffic), wherein the transceiver component 102 can receive traffic from a communication device and can transmit traffic to a communication device. The transceiver component 102 can be, or can be part of, a device that can communicate traffic. For example, the transceiver component 102 can be, or can be part of, a modem or router (e.g., a 10 gigabit per second (G) modem or router (e.g., a 10G-baseT modem or router), a 40G modem or router (e.g., a 40G-baseT modem or router), a 100G modem or router (e.g., a 100G-baseT modem or router), or a modem or router that can employ another communication rate), a switch that can facilitate communication of traffic, a communication device that can employ optical communications technology and/or wireless communications technology, or another type of communication transceiver.

The transceiver component 102 can comprise one or more (e.g., 1, 2, 3, 4, ...) transmitters and one or more (e.g., 1, 2, 3, 4, ...) receivers that can facilitate transmitting and receiving voice or data communications. In some implementations, the transceiver component 102 can employ a full-duplex system that can allow simultaneous communication in both directions. The transceiver component also can employ one or more sensing devices such as one or more antennas that can facilitate voice or data communications.

To facilitate communication of traffic associated with the transceiver component 102, the transceiver component 102 can comprise a filter component 104 that can comprise a set (e.g., N) of filter sub-components, such as, for example, filter sub-component$_1$ 106, up through filter sub-component$_N$ 108, wherein N can be virtually any desired integer number (e.g., N can be 2, 3, 4, or more). Respective filter sub-components (e.g., 106, 108) can perform respective filter processes on signals to desirably filter signals and produce filtered signals as an output. The set of filter sub-components can comprise, for example, an echo cancellation filter, an equalizer filter, a feed-forward equalizer (FFE) filter, Tomlinson Harashima precoding (THP) filter, a decision feedback equalizer (DFE) filter, a feed-forward filter (FFF), a multi-tap filter, a near end crosstalk (NEXT) filter, a far end crosstalk (FEXT) filter, multirate filters, and/or another type(s) of filter(s). The filter sub-components (e.g., 106, 108) can be or can comprise adaptive filters that can be adapted, configured, updated, transformed, or tuned to facilitate desirably filtering signals (e.g., canceling or reducing echo, reducing cross-talk, reducing noise, reducing distortion, equalizing, etc., of the signals) based at least in part on the respective characteristics of the signals and/or the communication channel(s) used to communicate the signals.

The system 100 also can comprise a multidimensional filter processor component 110 that can facilitate quickly and efficiently performing filtering of signals (e.g., traffic), and filter adaptations of the filter component 104, associated with the transceiver component 102. The multidimensional filter processor component 110 can be associated with (e.g., communicatively connected to) the filter component 104, and can control operations, functions, processes, etc., of or associated with the filter component 104.

In some implementations, the multidimensional filter processor component 110 can facilitate performing configurations and adaptations of multiple digital filters (e.g., filter sub-component$_1$ 106, filter sub-component$_N$ 108) associated with the filter component 104. The multidimensional filter processor component 110 can treat and manage multiple, separate filters (e.g., filter sub-component$_1$ 106, filter sub-component$_N$ 108, and/or another filter sub-component(s)) of the filter component 104 as a single larger multidimensional filter, and can jointly adapt or update (e.g., adapt or update at the same time) the multiple filter sub-components of the filter component 104 in a single adaptation operation (e.g., in a joint or parallel adaptation of multiple filters), instead of performing separate adaptation operations on separate filters.

To facilitate multidimensional joint filter adaptation, the multidimensional filter processor component 110 can manage the respective correlations (e.g., cross-correlations) associated with the inputs of the filters. In some implementations, the multidimensional filter processor component 110 can facilitate multidimensional filter adaptation by performing multidimensional filter adaptation in the frequency domain, wherein multidimensional filter processor component 110 can perform the multidimensional filter adaptation in parallel for multiple (e.g., many) frequency sub-channels (e.g., frequency-domain sub-channels). In certain other implementations, the multidimensional filter processor component 110 can facilitate multidimensional filter adaptation by performing multidimensional filter adaptation using other transform domain filterings, such as, for example, Hadamard/Walsh, Fast-Cosine-Transform, Fast-FIR filtering, etc.

When employing filter adaptation in the frequency domain, for example, for each frequency sub-channel, the multidimensional filter processor component 110 can perform an adaptation, such as, for example, a MIMO LMS adaptation or another type of filter adaptation, as disclosed herein. As part of the adaptation process, the multidimensional filter processor component 110 can generate a respective update matrix (or matrices) (e.g., a respective MIMO LMS update matrix (or matrices)) for each frequency sub-channel to facilitate performing the update to facilitate managing different cross-correlations associated with different frequency sub-channels of the respective filter sub-components (e.g., filter sub-component$_1$ 106, filter sub-component$_N$ 108, and/or another filter sub-component(s)).

The multidimensional filter processor component 110 can monitor conditions, such as communication conditions, associated with the transceiver component 102. For instance, the multidimensional filter processor component 110 can monitor conditions associated with the transceiver component 102 during initialization of (e.g., switching on of, start-up of, or restart of) the transceiver component 102, connection of a communication cable or channel to the transceiver component 102, or during operation of the transceiver component 102 to facilitate learning or detecting the conditions (e.g., communication conditions) associated with the transceiver component 102, including the conditions associated with the inputs to the filter sub-components (e.g., 106, 108) of the filter component 104. For example, during operation of the transceiver component 102, the multidimensional filter processor component 110 can detect whether there has been a change in conditions associated with the transceiver component 102 to facilitate determining whether a defined amount or type of change in conditions has occurred to warrant and/or to trigger performing a filter adaptation of the filter sub-components (e.g., 106, 108). The change in communication conditions can be the result of, for example, movement or shaking of communication cable associated with the transceiver component 102, outside interference (e.g., electromagnetic interference) with the communication cable or channel, etc. The multidimensional filter processor component 110 also can facilitate obtaining other information relating to the transceiver component 102, communication cable or communication channel, etc. For example, the multidimensional filter processor component 110 can receive, obtain, identify, estimate, or determine a type of each filter sub-component (e.g., equalizer filter, echo cancellation filter. NEXT filter, etc.); a manufacturer or model of a communication cable; properties, characteristics, materials, channel loss, bit error rate (BER), an amount or type of change in communication conditions (e.g., over a defined period of time), etc., of the communication channel; configuration of the transceiver component 102; desired customer specifications or preferences relating to the transceiver component 102; etc.

The multidimensional filter processor component 110 can analyze or evaluate the information relating to the conditions, and the other information, associated with the transceiver component 102. The multidimensional filter processor component 110 can determine or identify whether a filter adaptation or update is to be performed to adapt the filter sub-components (e.g., 106, 108) based at least in part on the results of the analysis or evaluation of the information relating to the conditions, and the other information, associated with the transceiver component 102. For example, the multidimensional filter processor component 110 can determine that a filter adaptation or update is to be performed to adapt the filter sub-components (e.g., 106, 108) when the results of the analysis or evaluation of the information relating to the conditions, and the other information, satisfy a defined set of filter adaptation criteria that indicates a filter adaptation is to be performed. The defined set of filter adaptation criteria that indicates a filter adaptation is to be performed can comprise or relate to, for example, a defined threshold for adaptation relating to a defined unacceptably slow convergence level for a filter sub-component (e.g., a filter input or a filter sub-channel of the filter sub-component), wherein the multidimensional filter processor component 110 can determine that a filter adaptation is to be performed for a filter sub-component when the analysis or evaluation results indicate that the defined threshold for adaptation is satisfied in connection with the filter sub-component.

In response to determining that a filter adaptation or update is to be performed, the multidimensional filter processor component 110 can determine, identify, estimate, or generate a cross-coupled correlation structure (e.g., autocorrelation structure, cross-coupled correlation function) (also referred to herein as a correlation structure or a cross-correlation structure) associated with the filter sub-components (e.g., the inputs of the filter sub-components (e.g., 106, 108)) based at least in part on the results of the analysis or evaluation of the information relating to the conditions, and the other information, associated with the transceiver component 102. For example, the multidimensional filter processor component 110 can determine the cross-correlation between the inputs of the filter sub-components (e.g., 106, 108) of the filter component 104 and can generate the cross-correlation structure based at least in part on the cross-correlation. The cross-correlation structure can be a multi-dimensional structure that can be based at least in part on (e.g., a function of) the number of filter sub-components employed by the filter component 104. For example, the multidimensional filter processor component 110 can determine or generate a cross-correlation structure that can comprise or correspond to a 2×2 matrix (or matrices) when there are 2 filter sub-components, a 3×3 matrix (or matrices) when there are 3 filter sub-components, a 4×4 matrix (or matrices) when there are 4 filter sub-components, etc., wherein the multi-dimensional matrix (or matrices) (e.g., cross-coupled autocorrelation matrix (or matrices)) can be structured and can comprise matrix values and functions that can take into account and/or be representative of the cross-correlation between inputs of the filter sub-components (e.g., 106, 108) of the filter component 104.

In some implementations, the multidimensional filter processor component 110 can determine, estimate, or generate the cross-correlation structure (or can directly determine or generate an inverse cross-coupled cross-correlation structure that inversely corresponds to the cross-correlation structure (e.g., without having to determine the cross-correlation structure) based at least in part on respective characteristics of the inputs to the adaptive filter sub-components (e.g., 106, 108). For example, if an input signal to one of the filter sub-components is known (e.g., by the multidimensional filter processor component 110) to have a negligible correlation to other filter inputs, the multidimensional filter processor component 110 can disregard or ignore this filter sub-component input when determining, generating, or computing the cross-correlation structure (and/or accordingly the inverse cross-correlation structure that is employed to counteract the cross-correlation associated with the cross-correlation structure).

In certain implementations, the multidimensional filter processor component 110 can determine or estimate respective channel responses of respective filter inputs of the filter sub-components (e.g., 106, 108). The multidimensional filter processor component 110 can determine or estimate the cross-correlation structure (or can directly determine or generate an inverse cross-coupled cross-correlation structure that inversely corresponds to the cross-correlation structure (e.g., without having to determine the cross-correlation structure) based at least in part on results of an analysis of the respective channel responses of the respective filter inputs of the filter sub-components (e.g., 106, 108). For example, the multidimensional filter processor component 110 can analyze information relating to the respective channel responses and/or other information (e.g., properties or characteristics relating to the transceiver component 102 or associated communication cable or channel) to facilitate determining or estimating cross-correlation, a cross-correlation structure, inverse cross-correlation, and/or an inverse cross-correlation structure associated with the respective filter inputs of the filter sub-components (e.g., 106, 108).

The multidimensional filter processor component 110 also can determine an inverse cross-coupled correlation structure (e.g., a cross-coupled decorrelation structure) (also referred to herein as an inverse correlation structure or decorrelation structure) based at least in part on the cross-correlation structure determined for the filter sub-components (e.g., 106, 108). The multidimensional filter processor component 110 can determine and generate an inverse correlation structure that can counter (e.g., counteract, offset, negate, reduce, minimize, etc.), or at least substantially counter, the effects of the cross-correlation between the inputs of the filter sub-components during the filter adaptation process to facilitate efficient (e.g., quick) joint convergence and adaptation of the filter sub-components (e.g., 106, 108). As disclosed herein, in some implementations, the multidimensional filter processor component 110 also can directly determine or estimate an inverse cross-coupled correlation structure, without having to determine or estimate the cross-correlation structure, for the filter sub-components (e.g., 106, 108) when performing a filter adaptation or update. For instance, the multidimensional filter processor component 110 can directly determine or estimate an inverse cross-coupled correlation structure based at least in part on analysis results obtained from analyzing the respective channel responses of filter inputs of the filter sub-components (e.g., 106, 108), information relating to the conditions associated with the transceiver component 102, or other information associated with the transceiver component 102 (e.g., properties or characteristics relating to the transceiver component 102 or associated communication cable or channel, and/or adaptation-related parameters (e.g., stored in a look-up table)).

The inverse correlation structure can be a multi-dimensional structure that can be based at least in part on (e.g., a function of) the number of filter sub-components employed by the filter component 104. For example, the multidimensional filter processor component 110 can determine or generate an inverse correlation structure that can comprise or correspond to a 2×2 matrix (or matrices) when there are 2 filter sub-components, a 3×3 matrix (or matrices) when there are 3 filter sub-components, a 4×4 matrix (or matrices) when there are 4 filter sub-components, etc., wherein the multi-dimensional matrix (or matrices) (e.g., cross-coupled auto-correlation matrix (or matrices)) can be structured and can comprise matrix values and functions that can facilitate counteracting the cross-correlation between the filter inputs of the filter sub-components (e.g., 106, 108) of the filter component 104.

The multidimensional filter processor component 110 can facilitate performing a joint (e.g., combined and/or simultaneous) adaptation of the filter sub-components (e.g., 106, 108) of the filter component 104 based at least in part on the inverse correlation structure. For instance, the multidimensional filter processor component 110 can jointly adapt or update the filter sub-components (e.g., 106, 108) using an adaptation process or structure (e.g., filter adaptation structure) that can be modified using the inverse correlation structure to facilitate counting or substantially countering the cross-correlation between the filter inputs of the filter sub-components identified by the multidimensional filter processor component 110 in connection with the joint adaptation operation. The multidimensional filter processor component 110, by jointly adapting the filter sub-components based at least in part on the inverse correlation structure, can perform filter adaptations that can be more efficient (e.g., use less time, use less resources (e.g., processor resources, computation cycles, etc.), etc.) than conventional filter adaptation systems and methods.

In some implementations, to facilitate performing the filter adaptation on the filter component 104, the multidimensional filter processor component 110 can perform the joint adaptation of the filter sub-components (e.g., 106, 108) of the filter component 104 in the frequency domain (or another desired transform domain (e.g., time domain), such as disclosed herein), as opposed to performing the adaptation on the filter component 104 in the time domain. For example, if the adaptation-related information associated with the filter component 104 is in the time domain, the multidimensional filter processor component 110 can transform (e.g., using a fast Fourier transform (FFT)) the adaptation-related information to the frequency domain, wherein the multidimensional filter processor component 110 can perform calculations or make determinations relating to the joint adaptation of the filter sub-components in the frequency domain, which can be more efficient than performing such operations in the time domain. In some instances, the adaptation-related information already can be in the frequency domain.

In some implementations, the multidimensional filter processor component 110 can perform joint adaptation of the filter sub-components (e.g., 106, 108) on a frequency sub-channel level, for example, where the joint adaptation of the filter sub-components is performed in the frequency domain. The multidimensional filter processor component 110 can determine and generate the respective cross-correlation structures for all or a desired portion of the frequency sub-channels of the respective filter sub-components (e.g., 106, 108). The combination of the respective cross-correlation structures can form a super (e.g., comprehensive) cross-correlation structure of the filter component 104 and its constituent filter sub-components (e.g., 106, 108). The multidimensional filter processor component 110 can determine and generate respective inverse correlation structures for all or a desired portion of the frequency sub-channels of the respective filter sub-components (e.g., 106, 108). The combination of the respective inverse correlation structures can form a super inverse correlation structure of the filter component 104 and its constituent filter sub-components (e.g., 106, 108). The multidimensional filter processor component 110 can apply the respective inverse correlation structures (e.g., sub-structures) during the joint filter adaptation process to jointly adapt the filter sub-components (e.g., 106, 108) in parallel for all or a desired portion of the frequency sub-channels of the respective filter sub-components.

Depending in part on the defined filter adaptation criteria and/or device or resource limitations associated with the transceiver component 102, it can or may be desirable to not determine and generate a different inverse correlation structure for each and every frequency sub-channel for a filter sub-component of the filter component 104. For instance, based at least in part to the defined filter adaptation criteria and/or device or resource limitations associated with the transceiver component 102, and/or the complexity of the cross-correlation structure or inverse cross-correlation structure, it can be desirable to configure the multidimensional filter processor component 110 to determine and generate respective inverse correlation structures for a subset of the set of the frequency sub-channels of the respective filter sub-components (e.g., 106, 108), wherein the subset of the frequency sub-channels can be determined to be those frequency sub-channels that satisfy a defined threshold(s) relating to cross-correlation (e.g., a defined threshold for adaptation), noise interference, etc.

For example, it can be determined (e.g., by the multidimensional filter processor component 110 or another component) that determining and generating respective inverse correlation structures for a first subset of the set of the frequency sub-channels of the respective filter sub-components (e.g., 106, 108) can result in a significant and desirable level of efficiency during the filter adaptation process that provides a benefit that exceeds the amount of resources and/or time used to determine and generate respective inverse correlation structures and perform the joint filter adaptation for the filter component 104. It also can be determined (e.g., by the multidimensional filter processor component 110 or another component) that determining and generating respective inverse correlation structures for a second subset of the set of the frequency sub-channels of the respective filter sub-components (e.g., 106, 108) will not or is estimated to not result in a level of efficiency during the filter adaptation process that justifies the use of the amount of resources and/or time it may take to determine and generate respective inverse correlation structures and perform the joint filter adaptation for the filter component 104. In accordance with this example, the multidimensional filter processor component 110 or another component can determine that the multidimensional filter processor component 110 is to determine and generate respective inverse correlation structures for the first subset of frequency sub-channels of the respective filter sub-components (e.g., 106, 108), but is not to determine and generate respective inverse correlation structures for the second subset of frequency sub-channels of the respective filter sub-components (e.g., 106, 108), in accordance with the defined filter adaptation criteria (and the corresponding defined threshold for adaptation). The defined threshold for adaptation can be or can comprise, example, defined threshold for adaptation relating to a defined unacceptably slow convergence level in connection with a filter input(s) of a filter sub-component(s).

That is, based on an analysis of information relevant to the filter adaptation, the multidimensional filter processor component 110 can determine that convergence will be, or is estimated to be, unacceptably slow with regard to the first subset of frequency sub-channels, but convergence will not be, or is estimated not to be, unacceptably slow with regard to the second subset of frequency sub-channels, in accordance with the defined filter adaptation criteria. Based on this, during the joint filter adaptation of the filter sub-components (e.g., 106, 108), the multidimensional filter processor component 110 can determine that an inverse cross-correlation structure(s) is to be applied to the first subset of frequency sub-channels, and that it is not necessary or desirable (e.g., based on a cost-benefit analysis) to determine and apply an inverse cross-correlation structure to the second subset of frequency sub-channels.

In some implementations, the multidimensional filter processor component 110 or another component can determine that an inverse correlation structure is to be determined for and applied to each frequency sub-channel of a subset of frequency sub-channels of a filter sub-component(s) (e.g., 106, 108) and/or another inverse correlation structure is to be determined for and applied to each frequency sub-channel of another subset of frequency sub-channels of the filter sub-component(s) (e.g., 106, 108), based at least in part on the defined filter adaptation criteria. In such instance, during the joint filter adaptation process, the multidimensional filter processor component 110 can determine and generate the inverse correlation structure that can be applied to each frequency sub-channel of the subset of frequency sub-channels of the filter sub-component(s) (e.g., 106, 108) and/or can determine and generate the other inverse correlation structure that can be applied to each frequency sub-channel of the other subset of frequency sub-channels of the filter sub-component(s) to facilitate jointly adapting the filter sub-components (e.g., 106, 108) for all or a desired portion of the frequency sub-channels.

For example, the multidimensional filter processor component 110 or another component can determine that a certain subset of frequency sub-channels can have (e.g., can share or have in common) same or similar (e.g., within a defined range) properties or characteristics in connection with cross-correlation, filter adaptation, interference, etc. The multidimensional filter processor component 110 or another component can determine that using the same inverse correlation structure for that subset of certain frequency sub-channels can result in a sufficient benefit in efficiency that justifies not using the additional resources to determine and use different inverse correlation structures for each of those certain frequency sub-channels, in accordance with the defined filter adaptation criteria. In such instance, the multidimensional filter processor component 110 or another component can determine that a same inverse correlation structure can be applied, and can apply that same inverse correlation structure, to each frequency sub-channel of that subset of certain frequency sub-channels of the filter sub-component(s) (e.g., 106, 108) during the joint filter adaptation process. The frequency sub-channels that subset of certain frequency sub-channels can be in a certain range of frequencies (e.g., all frequency sub-channels between a first (or lower) frequency and a second (or higher) frequency) or can be various frequencies across the frequency spectrum.

In an instance where it is determined that a same inverse correlation structure is to be applied to a subset of certain frequency sub-channels, the multidimensional filter processor component 110 can determine and generate a cross-correlation structure that can be associated with the subset of certain frequency sub-channels based at least in part on the defined filter adaptation criteria. The multidimensional filter processor component 110 also can determine and generate the inverse correlation structure for the subset of certain frequency sub-channels, or can determine and generate an inverse correlation structure for all of the frequency sub-channels and can determine or select a portion or a subset of that inverse correlation structure to apply to the subset of certain frequency sub-channels, based at least in part on the defined filter adaptation criteria. For instance, the multidimensional filter processor component 110 can determine which frequency sub-channels are to be included in the subset of certain frequency sub-channels, and can determine the cross-correlation and inverse correlation structure for that subset based at least in part on an average or median value(s) of a parameter(s) associated with the subset of certain frequency sub-channels, a maximum or minimum value(s) of a parameter(s) associated with the subset of certain frequency sub-channels, a value of a parameter of a first frequency sub-channel in relation to (e.g., as compared to) a value of that parameter for a second frequency sub-channel, a characteristic(s) or property(ies) associated with a communication cable associated with the transceiver component 102, a type(s) of filter sub-component(s) being employed by the transceiver component 102, or another criterion, in accordance with the defined filter adaptation criteria.

The multidimensional filter processor component 110 also can determine or estimate a correlation structure or an inverse correlation structure in connection with an adaptation of the filter sub-components (e.g., 106, 108), and can determine an approximation of the correlation structure or the inverse correlation structure to generate an approximated correlation structure or an approximated inverse correlation structure. The multidimensional filter processor component 110 can apply the approximated inverse correlation structure to the filter sub-components (e.g., 106, 108) to facilitate jointly adapting the filter sub-components (e.g., 106, 108). This approximation of the cross-correlation structure or inverse correlation structure can be performed by the multidimensional filter processor component 110 to facilitate reducing the complexity of the filter adaptation of the filter sub-components (e.g., 106, 108) and/or reducing the amount of resources or time used by the multidimensional filter processor component 110 and other components of the transceiver component 102 to perform the filter adaptation.

In certain implementations, the multidimensional filter processor component 110 can perform joint adaptation of the filter sub-components (e.g., 106, 108) using an augmented (e.g., cross-coupled) MIMO LMS adaptation (e.g., in accordance with an augmented MIMO LMS adaptation algorithm) that can be modified to facilitate taking into account the cross-correlation between the inputs of the respective filter sub-components (e.g., 106, 108), as more fully disclosed herein. In accordance with various other implementations, the multidimensional filter processor component 110 can perform joint adaptation of the filter sub-components (e.g., 106, 108) using another type of augmented (e.g., cross-coupled) filter adaptation technique (e.g., augmented (e.g., cross-coupled) normalized LMS adaptation, augmented (e.g., cross-coupled) affine projection LMS adaptation, augmented (e.g., cross-coupled) recursive least-squares (RLS) adaptation, augmented (e.g., cross-coupled) blind adaptation, another type of augmented (e.g., cross-coupled) iterative filtering coefficient adaptation configuration, etc., in accordance with a corresponding augmented normalized LMS, affine projection LMS, RLS, blind, iterative filter adaptation, or other adaptation algorithm) that can be modified to facilitate taking into account the cross-correlation between the inputs of the respective filter sub-components (e.g., 106, 108). The multidimensional filter processor component 110 also can facilitate performing joint adaptation of the filter sub-components (e.g., 106, 108) using various other techniques or models, such as, for example, a parametric model, or a non-parametric model.

The multidimensional filter processor component 110 also can modify iterative filter updates of the first filter sub-component 106 or the second filter sub-component 108 based at least in part on information relating to a cross-correlation structure and/or other information relevant to adaptation of the filter sub-components (e.g., 106, 108), when in accordance with the defined filter adaptation criteria. The multidimensional filter processor component 110 also can perform a transformation of a filter input of a filter sub-component (e.g., 106) based at least in part on information relating to the cross-coupled correlation structure and/or other information relevant to adaptation of the filter sub-component, when in accordance with the defined filter adaptation criteria.

It is to be appreciated and understood that the joint adaptation process (e.g., joint cross-coupled filter adaptation process) for adapting or updating the filter sub-components can be modified from the example implementations described herein, in accordance with defined filter adaptation criteria, to facilitate more efficiently jointly adapting filter sub-components under different operation scenarios, based at least in part on the techniques and principles of the subject matter disclosed herein. Such modifications of the example implementations are contemplated as being part of and covered by the disclosed subject matter.

In accordance with various implementations, the multidimensional filter processor component 110 can determine all or a portion of a cross-correlation structure or an inverse correlation structure, including respective adaptation-related parameters, in real or near real time (e.g., "on the fly"), and/or can use pre-computed or pre-determined adaptation-related parameters to facilitate determining or identifying corresponding adaptation-related parameters (e.g., mapped to the pre-computed or pre-determined adaptation-related parameters). For instance, in some implementations, the multidimensional filter processor component 110 or another component can pre-compute or pre-determine at least some of the adaptation-related parameters (e.g., communication condition-related parameters) relating to performing filter adaptations on the filter sub-components (e.g., 106, 108) of the transceiver component 102. The multidimensional filter processor component 110 or another component can store the pre-computed or pre-determined parameters in a look-up table, wherein, during operation of the transceiver component 102, the multidimensional filter processor component 110 can access the look-up table to reference or identify an adaptation-related parameter(s) in the look-up table to facilitate identifying or determining other adaptation-related parameters (e.g., filter coefficient values, values or functions relating to cross-correlation or inverse correlation associated with the filter sub-components, filter adaptation matrix values, etc.) that can be used to facilitate performing a filter adaptation of the filter sub-components (e.g., 106, 108). For instance, the multidimensional filter processor component 110 or another component can generate a mapping of a first subset of adaptation-related parameters to a second subset of adaptation-related parameters that can be stored in the look-up table, wherein, during operation of the transceiver component 102, the multidimensional filter processor component 110 can access the look-up table and associated mapping to facilitate identifying or determining an adaptation-related parameter(s) in the second subset based at least in part on an adaptation-related parameter(s) in the first subset. The multidimensional filter processor component 110 or another component also can store other information (e.g., characteristics, properties, etc.) relating to the transceiver component 102 or associated communication cable in the look-up table, wherein respective pieces of the other information also can be mapped to other pieces of the other information, adaptation-related parameters, or other information.

For example, during operation of the transceiver component 102, the multidimensional filter processor component 110 can receive (e.g., obtain via measurement) a first adaptation-related parameter, access the look-up table and/or associated mapping, and identify the first adaptation-related parameter in the look-up table and/or associated mapping. The multidimensional filter processor component 110 can determine or identify a second adaptation-related parameter based at least in part on the first adaptation-related parameter and information in the look-up table and/or the associated mapping. As appropriate, in accordance with the defined filter adaptation criteria, the multidimensional filter processor component 110 can use the second adaptation-related parameter, and/or the first adaptation-related parameter, to facilitate determining or generating a cross-correlation structure, inverse correlation structure, or other adaptation-related structure or function to facilitate performing a filter adaptation on the filter sub-components (e.g., 106, 108) of the filter component 104.

Figure 2:
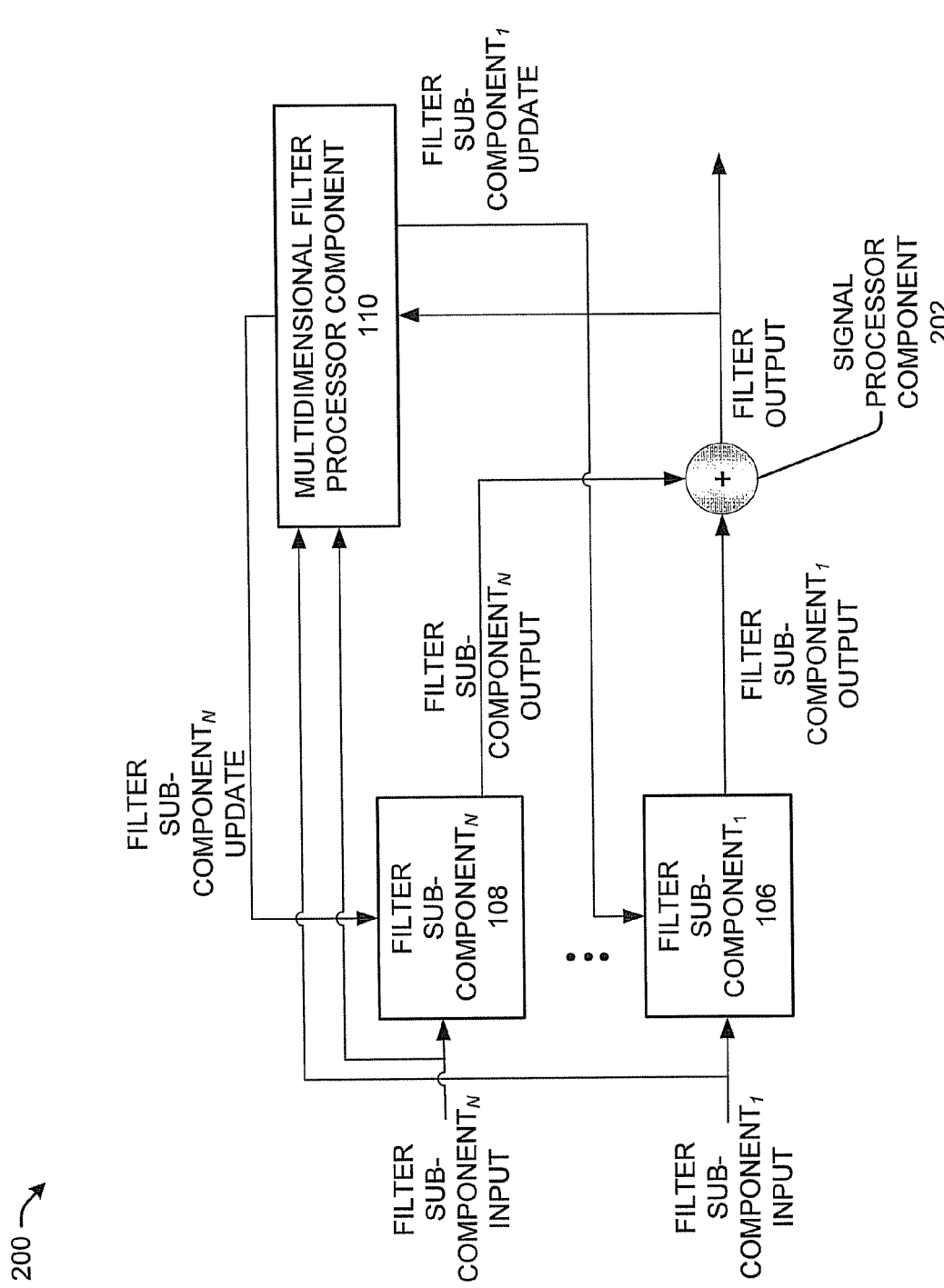
FIG. 2 is a block diagram depicting an example, non-limiting embodiment of a system that can facilitate managing configuration and adaptation of filters associated with a transceiver component, in accordance with various aspects and embodiments of the disclosed subject matter.

Referring briefly to FIG. 2 (along with FIG. 1), FIG. 2 depicts a block diagram of another example, non-limiting system 200 that can facilitate managing configuration and adaptation of filters associated with a transceiver component, in accordance with various aspects and embodiments of the disclosed subject matter. FIG. 2 can facilitate illustrating aspects relating to the data flow between the respective inputs and outputs of the respective components of the system 200.

The system 200 can comprise the filter sub-component$_1$ 106 and (up through) the filter sub-component$_N$ 108 (e.g., of the filter component 104) and the multidimensional filter processor component 110. The respective filter sub-components (e.g., 106, 108) can have respective input signals (e.g., filter sub-component$_1$ input up through filter sub-component$_N$ input) at the respective input ports of the respective filter sub-components. The respective filter sub-components (e.g., 106, 108) can provide respective output signals (e.g., respectively filtered signals, such as the filter sub-component$_1$ output up through the filter sub-component$_N$ output) of the respective filter sub-components. The respective filter sub-component outputs (e.g., filter sub-component$_1$ output up through filter sub-component$_N$ output) can be integrated, combined, summed, or otherwise processed by a signal processor component 202 (which can be part of the filter component 104, multidimensional filter processor component 110, or another component) to facilitate generating (e.g., producing) a filter output that can be a signal provided as an output from the filter component. The signal output from the filter component can be further processed and/or presented via a desired interface (e.g., audio interface) of the transceiver component to a user.

As more fully disclosed herein, the multidimensional filter processor component 110 can monitor the respective inputs (e.g., filter sub-component$_1$ input up through filter sub-component$_N$ input) at the respective input ports of the respective filter sub-components (e.g., 106, 108) to facilitate obtaining information relating to conditions associated with the filter sub-component inputs to facilitate determining whether a filter adaptation or update is to be performed on the respective filter sub-components (e.g., 106, 108). Employing the techniques, methods, and implementations disclosed herein, in response to determining that a filter adaptation is to be performed, the multidimensional filter processor component 110 can determine or estimate a cross-correlation structure(s) and/or inverse cross-correlation structure(s) based at least in part on the information relating to conditions associated with the filter sub-component inputs of the filter sub-components (e.g., 106, 108). The multidimensional filter processor component 110 can determine, estimate, or generate one or more respective filter sub-component updates (e.g., filter sub-component$_1$ update and/or (up through) filter sub-component$_N$ update) based at least in part on the inverse cross-correlation structure(s), in accordance with the defined filter adaptation criteria.

The multidimensional filter processor component 110 can communicate the one or more respective filter sub-component updates (e.g., filter sub-component$_1$ update and/or (up through) filter sub-component$_N$ update) to the one or more respective filter sub-components (e.g., filter sub-component$_1$ 106 and/or (up through) filter sub-component$_N$ 108) to facilitate jointly adapting or updating the one or more respective filter sub-components. The one or more respective filter sub-component updates (e.g., filter sub-component$_1$ update and/ or (up through) filter sub-component$_N$ update) can facilitate desirably jointly adapting or updating the one or more respective filter sub-components to facilitate efficiently (e.g., quickly) jointly converging the respective filter sub-components (e.g., 106, 108) in relation to (e.g., in connection with) the respective inputs and/or frequency sub-channels of the respective filter sub-components.

Figure 3:
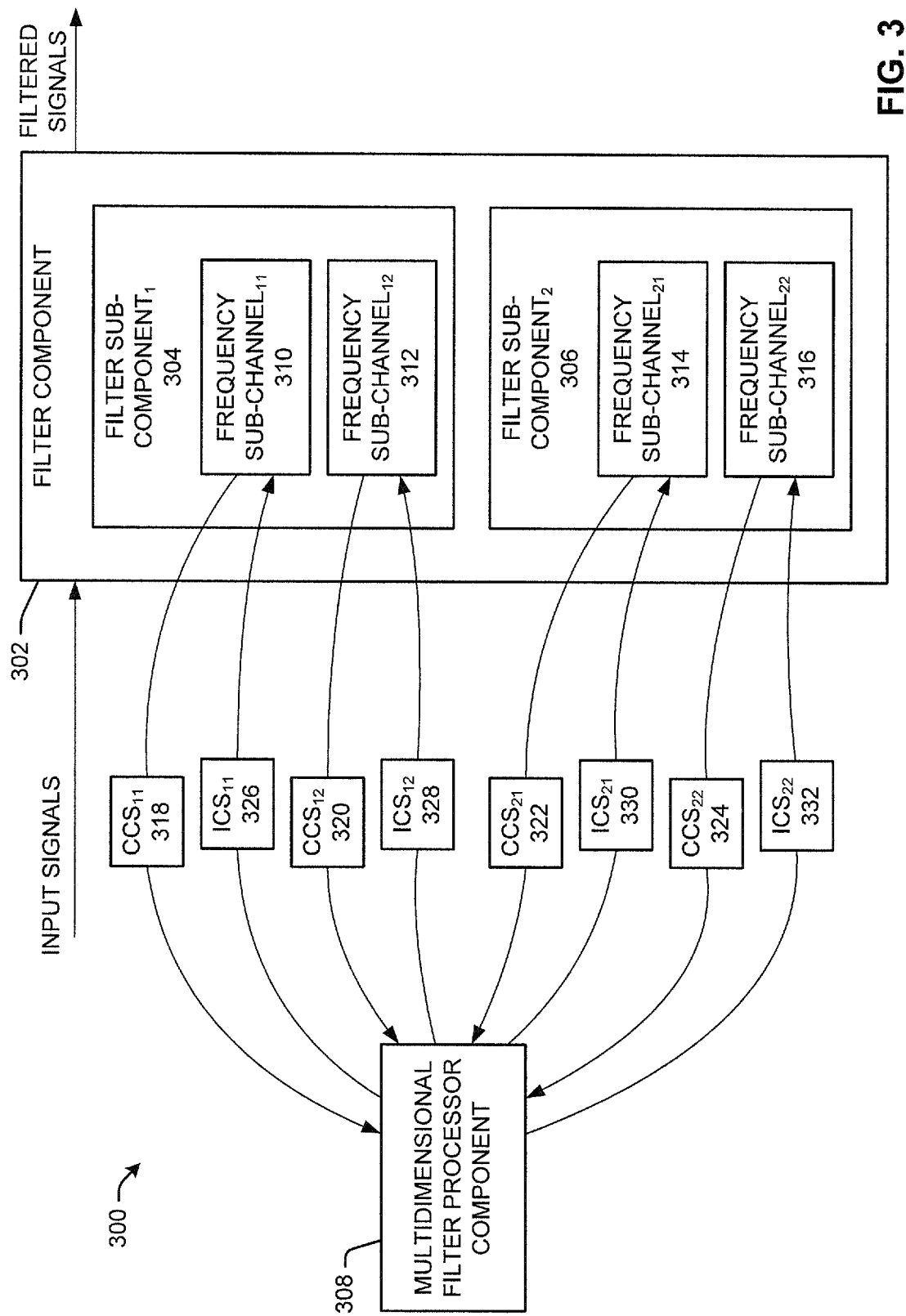
FIG. 3 is a block diagram depicting an example, non-limiting embodiment of a system that can facilitate joint adaptation of filter sub-components (e.g., filters) of a transceiver component in accordance with various aspects described herein is shown.

FIG. 3 depicts a block diagram of an example, non-limiting embodiment of a system 300 that can facilitate joint adaptation of filter sub-components (e.g., filters) of a transceiver component in accordance with various aspects described herein is shown. The system 300 can be part of a transceiver component, for example.

The system 300 can comprise a filter component 302 that can include a plurality (e.g., N) of filter sub-components (e.g., filters), comprising a filter sub-component$_1$ 304 and a filter sub-component$_2$ 306. The filter sub-components can comprise respective filters (e.g., FFF, echo cancellation filter, etc.) that can be used to filter signals received or transmitted by the transceiver component.

The system 300 can comprise the multidimensional filter processor component 308 that can efficiently perform joint adaptations of filter sub-components (e.g., 304, 306) at desired times (e.g., when a filter-adaptation condition or event occurs), in accordance with the defined filter adaptation criteria, as more fully disclosed herein. The multidimensional filter processor component 308 can facilitate jointly adapting the filter sub-components (e.g., 304, 306) by adapting many frequency sub-channels in parallel. For instance, the filter sub-component$_1$ 304 can comprise a plurality of frequency sub-channels, including frequency sub-channel$_{11}$ 310 and frequency sub-channel$_{12}$ 312. The filter sub-component$_2$ 306 also can comprise a plurality of frequency sub-channels, including frequency sub-channel$_{21}$ 314 and frequency sub-channel$_{22}$ 316. The multidimensional filter processor component 308 can facilitate jointly adapting the filter sub-components (e.g., 304, 306) by adapting all or a portion of the frequency sub-channels (e.g., 310, 312, 314, 316) of the filter sub-components (e.g., 304, 306) in parallel.

To facilitate efficiently performing the joint adaptation of the filter sub-components (e.g., 304, 306), the multidimensional filter processor component 308 can determine the cross-correlation between the filter inputs of the filter sub-components (e.g., 304, 306). For instance, the multidimensional filter processor component 308 can determine respective cross-correlation structures for each frequency sub-channel, such as a cross-correlation structure$_{11}$ 318 (CCS$_{11}$ 318) that can be or can correspond to the cross-correlation associated with the frequency sub-channel$_{11}$ 310, a cross-correlation structure$_{12}$ 320 (CCS$_{12}$ 320) that can be or can correspond to the cross-correlation associated with the frequency sub-channel$_{12}$ 312, a cross-correlation structure$_{21}$ 322 (CCS$_{21}$ 322) that can be or can correspond to the cross-correlation associated with the frequency sub-channel$_{21}$ 314, and a cross-correlation structure$_{22}$ 324 (CCS$_{22}$ 324) that can be or can correspond to the cross-correlation associated with the frequency sub-channel$_{22}$ 316.

The multidimensional filter processor component 308 also can determine respective inverse correlation structures for each frequency sub-channel to facilitate counteracting, or at least substantially counteracting, the respective cross-correlations associated with the frequency sub-channels (e.g., 310, 312, 314, 316). For instance, the multidimensional filter processor component 308 can determine respective inverse correlation structures for each frequency sub-channel, such as an inverse correlation structure$_{11}$ 326 (ICS$_{11}$ 326) that can inversely correspond to the cross-correlation structure$_{11}$ 318 to facilitate counteracting the cross-correlation associated with the frequency sub-channel$_{11}$ 310, an inverse correlation structure$_{12}$ 328 (ICS$_{12}$ 328) that can inversely correspond to the cross-correlation structure$_{12}$ 320 to facilitate counteracting the cross-correlation associated with the frequency sub-channel$_{12}$ 312, an inverse correlation structure$_{21}$ 330 (ICS$_{21}$ 330) that can inversely correspond to the cross-correlation structure$_{21}$ 322 to facilitate counteracting the cross-correlation associated with the frequency sub-channel$_{21}$ 314, and an inverse correlation structure$_{22}$ 332 (ICS$_{22}$ 332) that can inversely correspond to the cross-correlation structure$_{22}$ 324 to facilitate counteracting the cross-correlation associated with the frequency sub-channel$_{22}$ 316.

The multidimensional filter processor component 308 can apply the respective inverse correlation structures (e.g., 326, 328, 330, 332) to the respective frequency sub-channels (e.g., 310, 312, 314, 316) in parallel to facilitate adapting the respective frequency sub-channels (e.g., 310, 312, 314, 316) of the filter sub-components (e.g., 304, 306). It is to be appreciated and understood that only 2 frequency sub-channels per filter sub-component are depicted in FIG. 3 for reasons of brevity and clarity, and, in accordance with various implementations, there can be more than 2 frequency sub-channels per filter sub-component that can be adapted (e.g., in parallel) during a filter adaptation operation performed by the multidimensional filter processor component 308. Further, in some implementations, the multidimensional filter processor component 308 can apply a same inverse correlation structure to a subset of frequency sub-channels comprising more than one frequency sub-channel to facilitate adapting the subset of frequency sub-channels (e.g., when in accordance with the defined filter adaptation criteria). For example, the subset of frequency sub-channels can comprise frequency sub-channels (e.g., that are within a certain frequency range) that can have similar characteristics (e.g., similar cross-correlation properties).

It is to be appreciated and understood that, while the disclosed subject matter often describes performing filter adaptation in the frequency domain, the disclosed subject matter is not so limited. In accordance with various implementations, the multidimensional filter processor component and associated components of the transceiver component can facilitate performing filter adaptations in the time domain or another desired transform domain. For example, the multidimensional filter processor component can determine, estimate, or apply a cross-correlation structure or inverse cross-correlation structure in the time domain to facilitate adapting or updating filter sub-components of the transceiver component. In the time domain, the cross-correlation structure can be or can comprise a time-domain cross-correlation matrix that comprises a set of vectors that can correspond to or represent the cross-correlation between respective filter inputs of the filter sub-components. The inverse cross-correlation structure can be or can comprise a time-domain inverse cross-correlation matrix that can comprise a set of vectors that can represent the inverse of or inversely correspond to the cross-correlation between respective filter inputs of the filter sub-components. Based on the disclosed subject matter, the techniques, methods, and implementations disclosed herein CaO be adapted to facilitate performing filter adaptations in the time domain or another desired transform domain, and such adaptations of the techniques, methods, and implementations disclosed herein are considered part of the disclosed subject matter.

Figure 4:
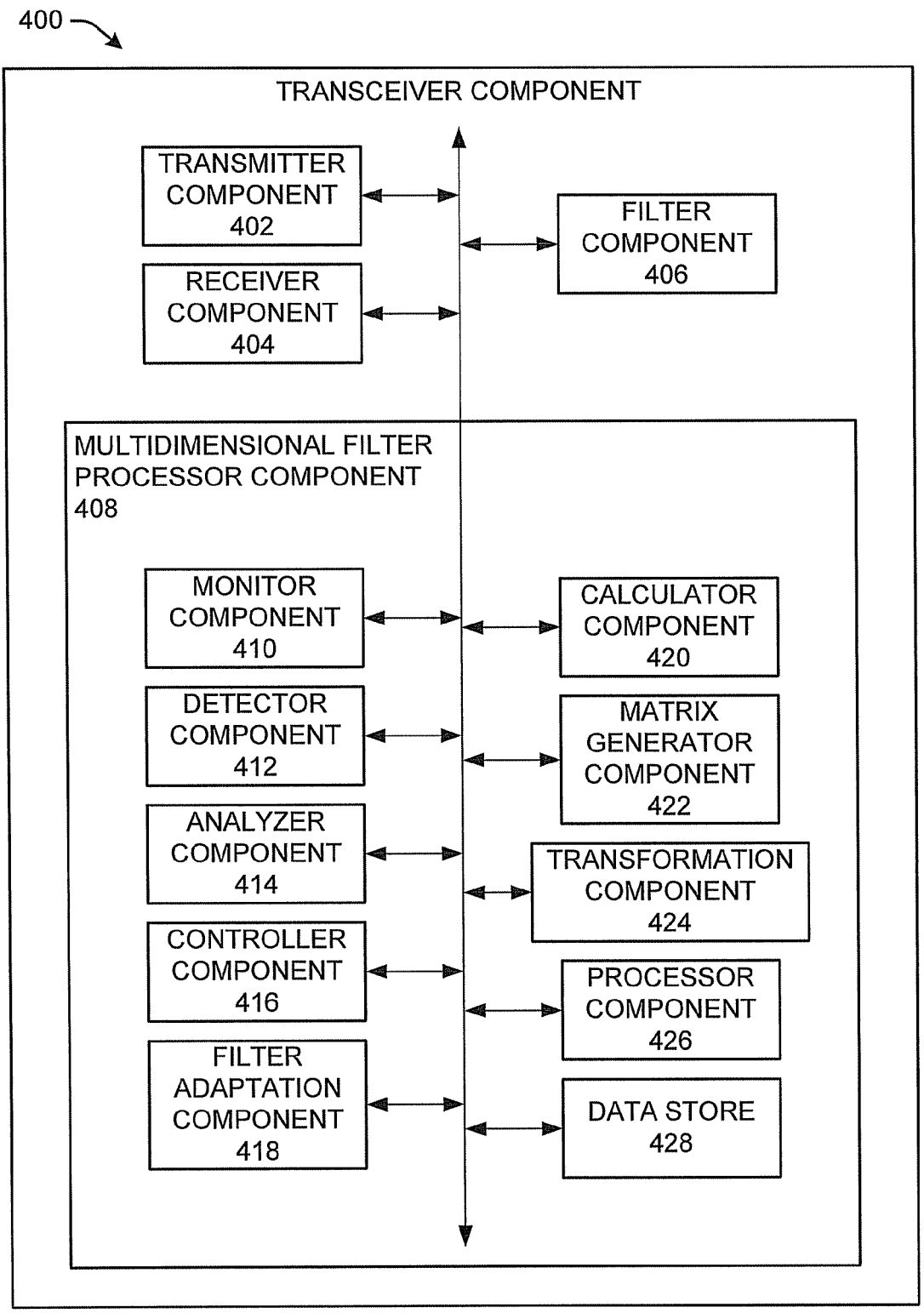
FIG. 4 illustrates a block diagram of an example, non-limiting embodiment of a transceiver component, in accordance with various aspects and embodiments of the disclosed subject matter.

FIG. 4 illustrates a block diagram of an example, non-limiting embodiment of a transceiver component 400, in accordance with various aspects and embodiments of the disclosed subject matter. The transceiver component 400 can be used to transmit or receive voice or data communications. In some implementations, the transceiver component 400 can be a full-duplex transceiver The transceiver component 400 can comprise a transmitter component 402 that can comprise one or more transmitter sub-components (e.g., transmitters) that can facilitate transmitting voice information or data from the transceiver component 400 to a communication device that is communicatively connected to the transceiver component 400 via a wireline, optical, or wireless communication connection (e.g., communication channel). In some implementations, the transmitter component 402 can include, for example, a plurality (e.g., 2, 3, 4, . . . ) of transmitter sub-components.

The transceiver component 400 also can comprise a receiver component 404 that can comprise one or more receiver sub-components (e.g., receivers) that can facilitate receiving voice information or data from a communication device that is communicatively connected to the transceiver component 400 via a wireline, optical, or wireless communication connection (e.g., communication channel). In some implementations, the receiver component 404 can include, for example, a plurality (e.g., 2, 3, 4, . . . ) of receiver sub-components.

The transceiver component 400 can include a filter component 406 that can comprise a set (e.g., N) of filter sub-components. The filter component can be associated with (e.g., connected to) the transmitter component 402 and the receiver component 404, for example, via a bus. Respective filter sub-components can perform respective filter processes on incoming or outgoing communication signals to desirably filter signals and produce filtered signals as an output. The set of filter sub-components can comprise, for example, an echo cancellation filter, an equalizer filter, an FFE filter, THP filter, a DFE filter, an FFF, a multi-tap filter, a NEXT filter, a FEXT filter, and/or another type(s) of filter(s). The filter sub-components can be or can comprise adaptive filters that can be adapted, updated, or tuned to facilitate desirably filtering signals (e.g., canceling or reducing echo, reducing cross-talk, reducing noise, reducing distortion, equalizing, etc., of the signals) based at least in part on the respective characteristics of the signals and/or the communication channel(s) used to communicate the signals.

The transceiver component 400 also can comprise a multidimensional filter processor component 408 that can be employed to facilitate efficiently and jointly adapting multiple filter sub-components in part by taking into account the cross-correlation between respective inputs of respective filter sub-components, as more fully disclosed herein. The multidimensional filter processor component 408 can be associated with (e.g., connected to) the transmitter component 402, the receiver component 404, and the filter component 406, for example, via a bus.

The multidimensional filter processor component 408 can include a monitor component 410 that can monitor conditions, such as communication conditions, associated with the transceiver component 400. For instance, the monitor component 410 can monitor conditions associated with the transceiver component 400 during initialization of (e.g., switching on of, start-up of, or restart of) the transceiver component 400, connection of a communication cable or channel to the transceiver component 400, or during operation of the transceiver component 400 to facilitate learning or detecting the conditions (e.g., communication conditions) associated with the transceiver component 400, including the conditions associated with the inputs to the filter sub-components of the filter component 406.

The multidimensional filter processor component 408 can include a detector component 412 that can detect conditions, including detecting a change in conditions or a filter-adaptation condition, associated with the transceiver component 400. For example, during operation of the transceiver component 400, the detector component 412 can detect whether there has been a change in conditions associated with the transceiver component 400 to facilitate determining whether a defined amount or type of change in conditions has occurred to warrant performing a filter adaptation of the filter sub-components (e.g., to facilitate determining whether a filter-adaptation condition has occurred). The change in communication conditions can be the result of, for example, movement or shaking of communication cable associated with the transceiver component 400, outside interference (e.g., electromagnetic interference) with the communication cable or channel, etc. The detector component 412 also can facilitate detecting or obtaining other information relating to the transceiver component 400, communication cable or communication channel, etc. For example, the detector component 412 can detect, receive, obtain, identify, or determine various properties or characteristics associated with components (e.g., filter sub-components, communication cables, etc.) of or connected to the transceiver component 400. The properties or characteristics of components can comprise, for example, a type of filter sub-component (e.g., equalizer filter, echo cancellation filter. NEXT filter, etc.); a manufacturer or model of a communication cable; properties, characteristics, manufacturing materials (e.g., types of metal(s) used in the cable, communication or conductive properties of the metal(s) used in the cable, etc.), etc., of the communication channel; desired customer specifications or preferences relating to the transceiver component 400; etc.

The multidimensional filter processor component 408 can contain an analyzer component 414 that can analyze data associated with the transceiver component 400 to facilitate performing filter adaptations. The data can relate to, for example, conditions (e.g., communication conditions or other types of conditions) associated with the transceiver component 400, properties or characteristics of components (e.g., communication cable, filter sub-components, etc.) associated with the transceiver component 400, filter coefficients, a cross-correlation between filter inputs of filter sub-components, a cross-correlation structure that can correspond to or be representative of the cross-correlation between filter inputs of filter sub-components, an inverse correlation structure that can inversely correspond to a cross-correlation structure, etc. The analyzer component 414 can generate analysis results that can be used by, for example, other components of the multidimensional filter processor component 408 to facilitate performing operations (e.g., operations relating to jointly adapting filter sub-components) associated with the multidimensional filter processor component 408. The analyzer component 414 also can operate in conjunction with other components (e.g., controller component 416, filter adaptation component 418, calculator component 420, etc.) to facilitate performing the operations associated with the multidimensional filter processor component 408.

The multidimensional filter processor component 408 also can comprise a controller component 416 that can control operations relating to processing data, adapting filter sub-components. The controller component 416 can facilitate controlling operations being performed by various components of the multidimensional filter processor component 408, controlling data flow between various components of the multidimensional filter processor component 408, controlling data flow between the multidimensional filter processor component 408 and other components of the transceiver component 400, etc.

The multidimensional filter processor component 408 can contain a filter adaptation component 418 that can facilitate determining a cross-correlation structure during a filter adaptation operation, determining an inverse correlation structure that can inversely correspond to the cross-correlation structure, performing an adaptation of the filter sub-components (e.g., based at least in part on the inverse correlation structure), or performing other operations relating to filter adaptation. In some implementations, the filter adaptation component 418 can facilitate utilizing the equations disclosed herein to facilitate determining a cross-correlation structure during a filter adaptation operation, determining an inverse correlation structure that can inversely correspond to the cross-correlation structure, or performing an update of the adaptive filter sub-components.

The multidimensional filter processor component 408 can comprise a calculator component 420 that can perform calculations (e.g., mathematical calculations) on data values using equations, including the equations disclosed herein, and/or matrices. The multidimensional filter processor component 408 can use the calculation results to facilitate determining cross-correlation between inputs of filter sub-components, an inverse correlation structure, filter adaptation (e.g., determining filter adaptation parameters (e.g., filter coefficients, etc.)), etc., to facilitate efficiently (e.g., quickly) performing a joint adaptation of multiple filter sub-components.

The multidimensional filter processor component 408 also can include a matrix generator component 422 that can generate matrices that can facilitate updating the adaptive filter sub-components. Some matrices can be, can correspond to, or can be representative of cross-correlation between filter inputs of the filter sub-components. Other matrices can be, can correspond to, or can be representative of an inverse correlation of the cross-correlation between filter inputs of the filter sub-components. Certain matrices also can relate to various intermediate mathematical operations that can be performed on data to facilitate jointly adapting filter sub-components.

The multidimensional filter processor component 408 also can include a transformation component 424 that can facilitate performing transformations on data. For instance, the transformation component 424 can perform an FFT on data in the time domain to transform the data to the frequency domain to facilitate adapting filter sub-components or performing other operations in connection with the transformed data. The transformation component 424 also can perform an inverse FFT on data in the frequency domain to transform such data to the time domain, for example, in connection with outputting signals relating to such data.

The transceiver component 400 also can comprise a processor component 426 that can operate in conjunction with the other components (e.g., transmitter component 402, receiver component 404, filter component 406, multidimensional filter processor component 408, etc.) to facilitate performing the various functions of the transceiver component 400. The processor component 426 can employ one or more processors (e.g., central processing units (CPUs), graphical processing units (GPUs), field-programmable gate arrays (FPGAs), etc.), microprocessors, or controllers that can process data, such as information (e.g., voice or data information) relating to operations performed by the transceiver component 400, etc., to facilitate transmitting signals, receiving signals, filtering signals, adapting filter sub-components, etc.; and can control data flow between the transceiver component 400 and other components associated with (e.g., connected to) the transceiver component 400 and can control data flow between various components of the transceiver component 400.

In yet another aspect, the transceiver component 400 also can include a data store 428 that can store data structures (e.g., voice information, data, metadata); code structure(s) (e.g., modules, objects, classes, procedures), commands, or instructions; information relating to adaptation of filter sub-components; information relating to cross-correlation between filter inputs of filter sub-components; information relating to inverse correlation structures, etc.; parameter data; algorithms (e.g., algorithm(s) relating to performing adaptation of filter sub-components, algorithm(s) relating to determining cross-correlation between filter inputs of filter sub-components, algorithm(s) relating to determining an inverse correlation structure, algorithms relating to FFTs and inverse FFTs, etc.); defined filter adaptation criterion(s); and so on. In an aspect, the processor component 426 can be functionally coupled (e.g., through a memory bus) to the data store 428 in order to store and retrieve information desired to operate and/or confer functionality, at least in part, to the transmitter component 402, receiver component 404, filter component 406, multidimensional filter processor component 408, etc., and/or substantially any other operational aspects of the transceiver component 400. It is to be appreciated and understood that the various components of the transceiver component 400 can communicate information between each other and/or between other components associated with the transceiver component 400 as desired to carry out operations of the transceiver component 400. It is to be further appreciated and understood that respective components (e.g., transmitter component 402, receiver component 404, filter component 406, multidimensional filter processor component 408, etc.) of the transceiver component 400 each can be a stand-alone unit, can be included within the transceiver component 400 (as depicted), can be incorporated within another component of the transceiver component 400 or a component separate from the transceiver component 400, and/or virtually any suitable combination thereof, as desired.

Figure 5:
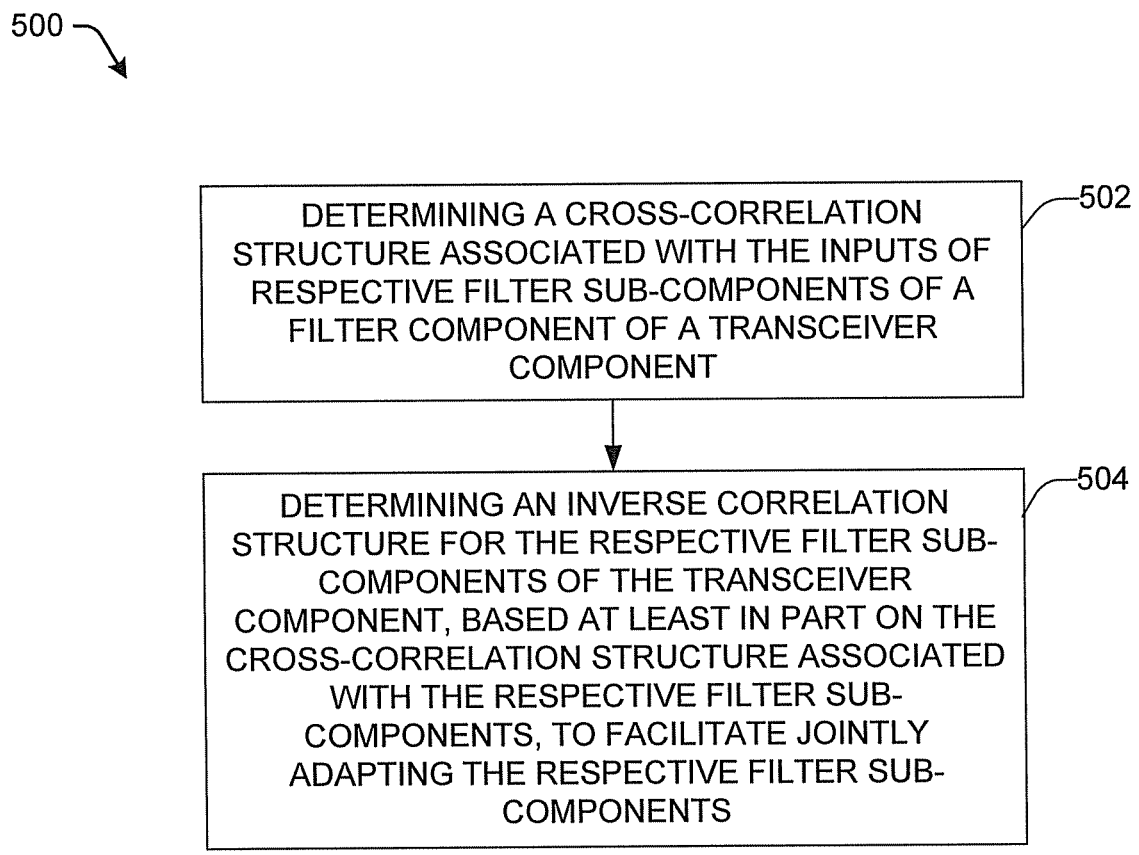
FIG. 5 illustrates a flow diagram of an example, non-limiting embodiment of a method that can facilitate performing joint adaptation of multiple filter sub-components of a transceiver component, in accordance with various aspects and embodiments of the disclosed subject matter.
Figure 6:
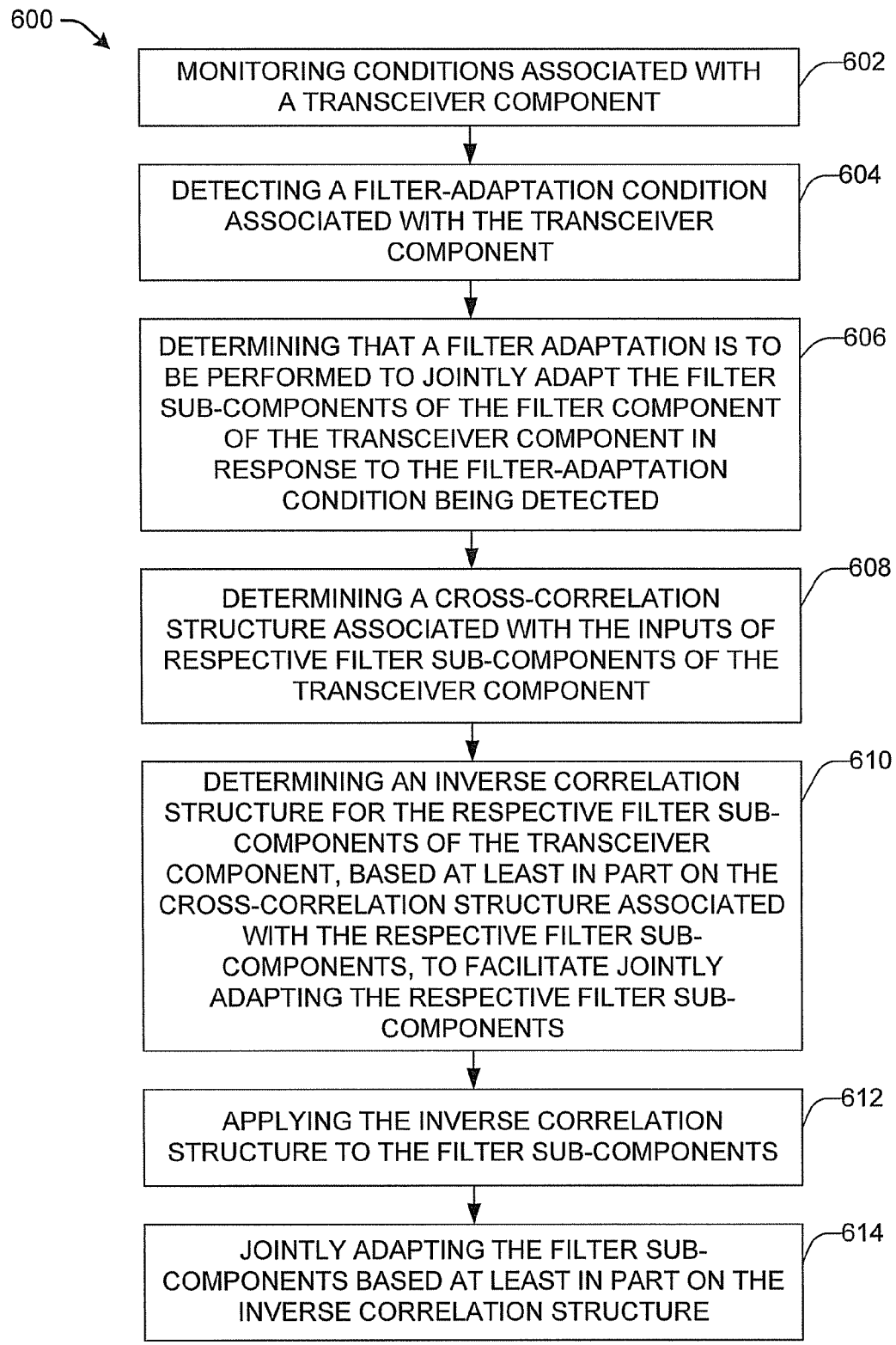
FIG. 6 illustrates a flow diagram of another example, non-limiting embodiment of a method that can facilitate performing joint adaptation of multiple filter sub-components of a transceiver component, in accordance with various aspects and embodiments of the disclosed subject matter.
Figure 7:
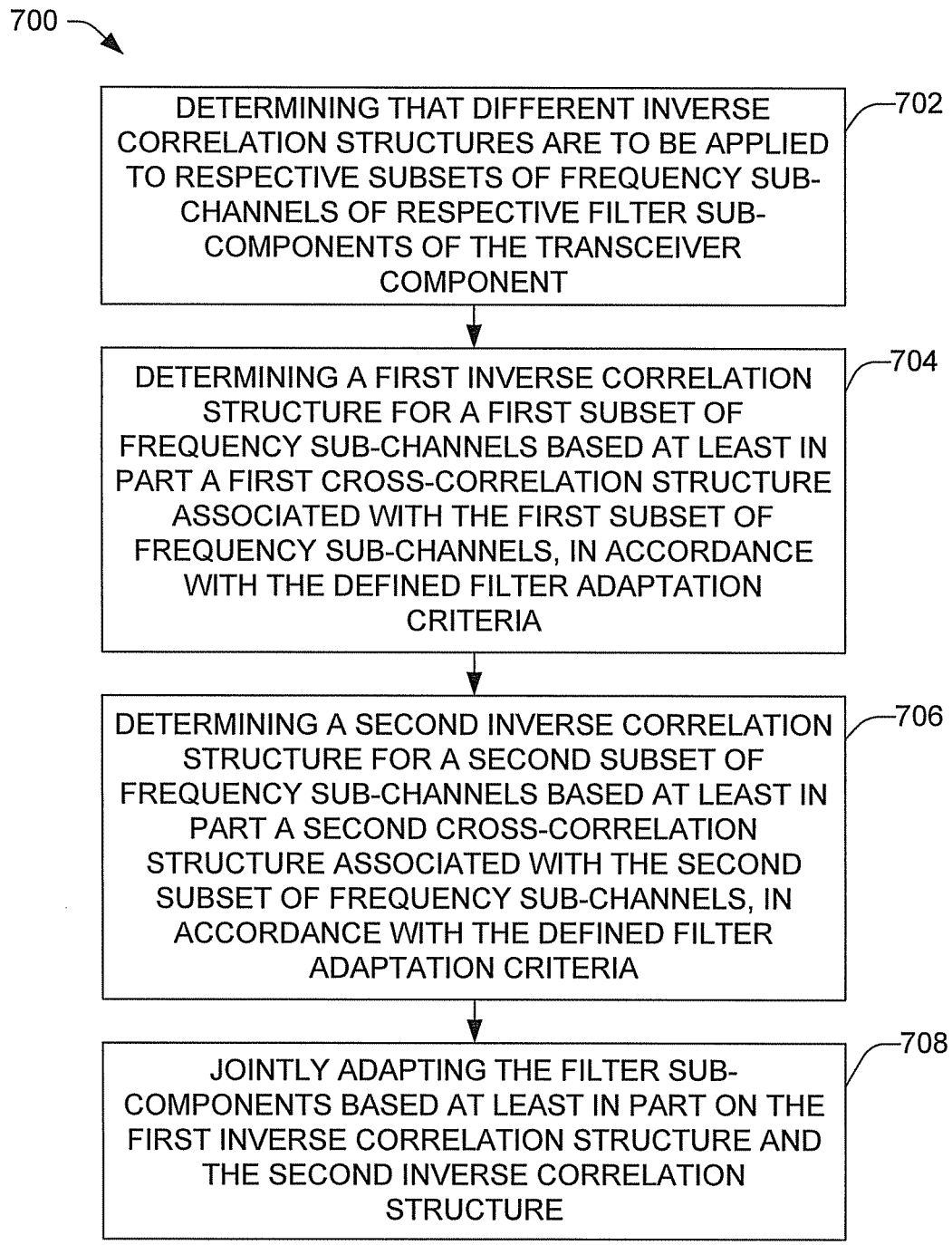
FIG. 7 illustrates a flow diagram of an example, non-limiting embodiment of a method that can jointly adapt multiple filter sub-components of a transceiver component for respective frequency sub-channels, in accordance with various aspects and embodiments of the disclosed subject matter.

In view of the example systems described above, methods that may be implemented in accordance with the described subject matter may be better appreciated with reference to the flow charts of FIGS. 5-7. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 5, a flow diagram of an example method 500 that can facilitate performing joint adaptation of multiple filter sub-components of a transceiver component, in accordance with various aspects and embodiments of the disclosed subject matter. The method 500 can be implemented, at least in part, by a multidimensional filter processor component of or associated with the transceiver component.

At block 502, a cross-correlation structure associated with the inputs of respective filter sub-components of a filter component of a transceiver component can be determined. In response to determining that a filter adaptation is to be performed on the filter sub-components of the transceiver component, the multidimensional filter processor component can determine cross-correlation between the inputs of respective filter sub-components of a transceiver component based at least in part on information relating to conditions (e.g., communication conditions, properties or characteristics of a communication cable associated with the transceiver component, etc.) associated with the transceiver component, in accordance with the defined filter adaptation criteria. The multidimensional filter processor component can determine a cross-correlation structure based at least in part on the determined cross-correlation between the inputs of the respective filter sub-components of the transceiver component.

At block 504, an inverse correlation structure for the respective filter sub-components of the transceiver component can be determined, based at least in part on the cross-correlation structure associated with the respective filter sub-components, to facilitate jointly adapting the respective filter sub-components. The multidimensional filter processor component can determine the inverse correlation structure based at least in part on the cross-correlation structure associated with the respective filter sub-components of the transceiver component, in accordance with the defined filter adaptation criteria.

Referring now to FIG. 6, a flow diagram of another example method 600 that can facilitate performing joint adaptation of multiple filter sub-components of a transceiver component, in accordance with various aspects and embodiments of the disclosed subject matter. The method 600 can be implemented, at least in part, by a multidimensional filter processor component of or associated with the transceiver component.

At block 602, conditions associated with the transceiver component can be monitored. The multidimensional filter processor component can monitor conditions, including communication conditions, associated with the transceiver component. The multidimensional filter processor component determine communication conditions associated with the transceiver component, determine or identify properties, conditions, or characteristics associated with components (e.g., communication cable or channel, filter sub-components, etc.) that are associated with the transceiver component.

At block 604, a filter-adaptation condition associated with the transceiver component can be detected based at least in part on information relating to the monitored conditions. The multidimensional filter processor component can detect the occurrence of a filter-adaptation condition associated with the transceiver component based at least in part on the analysis of the information relating to the conditions associated with the transceiver component and the defined filter adaptation criteria (e.g., criteria relating to when filter adaptation is triggered). For example, the multidimensional filter processor component can detect a filter-adaptation condition in response to detecting a start-up (e.g., switching on, re-starting) of the transceiver component, a connection of the communication cable to the transceiver component, when a communication connection of the transceiver component to a communication channel is being established, or when a defined change in communication conditions associated with the transceiver component is detected.

At block 606, it can be determined that a filter adaptation is to be performed to jointly adapt the filter sub-components of the filter component of the transceiver component in response to the filter-adaptation condition being detected. In response to detecting the filter-adaptation condition, the multidimensional filter processor component can determine that a filter adaptation is to be performed to jointly adapt the filter sub-components of the filter component of the transceiver component, in accordance with the defined filter adaptation criteria.

At block 608, a cross-correlation structure associated with the inputs of respective filter sub-components of the transceiver component can be determined. In response to determining that a filter adaptation is to be performed on the filter sub-components of the transceiver component, the multidimensional filter processor component can determine the cross-correlation between the inputs of respective filter sub-components of a transceiver component based at least in part on information relating to the conditions (e.g., communication conditions, properties or characteristics of a communication cable associated with the transceiver component, etc.) associated with the transceiver component, in accordance with the defined filter adaptation criteria. The multidimensional filter processor component can determine a cross-correlation structure based at least in part on the determined cross-correlation between the inputs of the respective filter sub-components of the transceiver component. In some implementations, the cross-correlation structure can be, for example, a super cross-correlation structure that can comprise a set of cross-correlation structures (e.g., sub-structures), wherein respective cross-correlation structures (e.g., sub-structures) can relate to respective frequency sub-channels (or frequency ranges of frequency sub-channels) of the respective filter sub-components to facilitate accounting for different cross-correlations that have been determined for different frequency sub-channels or different ranges of frequency sub-channels.

At block 610, an inverse correlation structure for the respective filter sub-components of the transceiver component can be determined, based at least in part on the cross-correlation structure associated with the respective filter sub-components, to facilitate jointly adapting the respective filter sub-components. The multidimensional filter processor component can determine the inverse correlation structure based at least in part on the cross-correlation structure associated with the respective filter sub-components of the transceiver component, in accordance with the defined filter adaptation criteria. The inverse correlation structure can be, for example, a super inverse correlation structure that can comprise a set of inverse correlation structures (e.g., sub-structures), wherein the multidimensional filter processor component can apply (e.g., in parallel) respective inverse correlation structures (e.g., sub-structures) to respective frequency sub-channels (or frequency ranges of frequency sub-channels) of the respective filter sub-components to facilitate jointly adapting or updating the respective filter sub-components. In other implementations, the multidimensional filter processor component can apply the same inverse correlation structure to the frequency sub-channels of the respective filter sub-components (e.g., in parallel) to facilitate jointly adapting or updating the respective filter sub-components.

At block 612, the inverse correlation structure can be applied to the filter sub-components to counter, or at least substantially counter, the cross-correlation associated with the filter sub-components. As part of the joint adaptation of the filter sub-components, the multidimensional filter processor component can apply the inverse correlation structure to the filter sub-components. The inverse correlation structure can facilitate offsetting or neutralizing, or at least substantially offsetting or neutralizing, the cross-correlation associated with the filter sub-components as indicated by the cross-correlation structure.

At block 614, the filter sub-components can be jointly adapted (e.g., adapted combinationally and/or at the same time) based at least in part on the inverse correlation structure. The multidimensional filter processor component can jointly adapt the filter sub-components based at least in part on the inverse correlation structure. During the joint adaptation of the multiple filter sub-components, which can be performed in the frequency domain, the multidimensional filter processor component can apply the inverse correlation structure (e.g., one or more inverse correlation sub-structures) to the frequency sub-channels in parallel. The multidimensional filter processor component can perform the adaptation on the frequency sub-channels using an augmented MIMO LMS adaptation technique, augmented RLS adaptation technique, augmented blind adaptation technique, or other type of adaptation technique, as disclosed herein.

Referring now to FIG. 7, a flow diagram of an example method 700 that can jointly adapt multiple filter sub-components (e.g., in a single adaptation operation that covers multiple filter sub-components) of a transceiver component for respective frequency sub-channels, in accordance with various aspects and embodiments of the disclosed subject matter. The method 700 can be implemented, at least in part, by a multidimensional filter processor component of or associated with the transceiver component.

At block 702, it can be determined that different inverse correlation structures are to be applied to respective subsets of frequency sub-channels of respective filter sub-components of the transceiver component, based at least in part on the defined filter adaptation criteria and conditions (e.g., communication conditions and/or other conditions) associated with the transceiver component and respective conditions or properties of respective frequency sub-channels of the respective filter sub-components. A subset of frequency sub-channels can comprise one or more frequency sub-channels (and corresponding frequency bins) of a filter sub-component(s) employed by the transceiver component. The multidimensional filter processor component can analyze conditions (e.g., communication conditions and/or other conditions) associated with the transceiver component. The multidimensional filter processor component can determine that different inverse correlation structures are to be applied to respective subsets of frequency sub-channels of respective filter sub-components of the transceiver component, based at least in part on the analysis results and the defined filter adaptation criteria.

For example, based at least in part on the analysis results and the defined filter adaptation criteria, the multidimensional filter processor component can determine or identify a first cross-correlation structure for a first subset of frequency sub-channels and a second cross-correlation structure for a second subset of frequency sub-channels. The multidimensional filter processor component also can determine that different inverse correlation structures can be or are to be used for the first subset of frequency sub-channels and the second subset of frequency sub-channels to facilitate achieving a defined threshold signal quality level, in accordance with the defined filter adaptation criteria.

At block 704, a first inverse correlation structure for a first subset of frequency sub-channels can be determined based at least in part a first cross-correlation structure associated with the first subset of frequency sub-channels, in accordance with the defined filter adaptation criteria. The multidimensional filter processor component can determine the first inverse correlation structure for the first subset of frequency sub-channels based at least in part the first cross-correlation structure, wherein the first inverse correlation structure can be tailored (e.g., adapted) to counter, or at least substantially counter, the cross-correlation between the filter inputs of the filter sub-components associated with the first subset of frequency sub-channels as indicated by the first cross-correlation structure.

At block 706, a second inverse correlation structure for a second subset of frequency sub-channels can be determined based at least in part a second cross-correlation structure associated with the second subset of frequency sub-channels, in accordance with the defined filter adaptation criteria. The multidimensional filter processor component can determine the second inverse correlation structure for the second subset of frequency sub-channels based at least in part the second cross-correlation structure, wherein the second inverse correlation structure can be tailored (e.g., adapted) to counter, or at least substantially counter, the cross-correlation between the filter inputs of the filter sub-components associated with the second subset of frequency sub-channels as indicated by the second cross-correlation structure.

At block 708, the filter sub-components can be jointly adapted based at least in part on the first inverse correlation structure and the second inverse correlation structure. The multidimensional filter processor component can jointly adapt the filter sub-components based at least in part on the first inverse correlation structure and the second inverse correlation structure.

The multidimensional filter processor component can facilitate jointly adapting the filter sub-components by applying the first inverse correlation structure to the first subset of frequency sub-channels to facilitate adapting the filter sub-components with regard to the first subset of frequency sub-channels. In parallel with applying the first inverse correlation structure to the first subset of frequency sub-channels, the multidimensional filter processor component can facilitate jointly adapting the filter sub-components by applying the second inverse correlation structure to the second subset of frequency sub-channels to facilitate adapting the filter sub-components with regard to the second subset of frequency sub-channels. It is to be appreciated and understood that, in some implementations, there can be more than two subsets of frequency sub-channels for which more than two inverse correlation structures can be determined and used to facilitate adapting (e.g., in parallel) the more than two subsets of frequency sub-channels.

The following disclosed subject matter describes various aspects and implementations relating to identifying or determining cross-correlation between filter inputs of filter sub-components associated with a transceiver component, identifying or determining an inverse correlation structure that can be used to facilitate adapting or updating filter sub-components for a transceiver component, and/or applying an inverse correlation structure(s) to facilitate countering cross-correlation between filter inputs of filter sub-components, etc., during or as part of a filter adaptation process to facilitate jointly adapting the filter sub-components while countering, or at least substantially countering, cross-correlation between the inputs of respective filter sub-components. The techniques, operations, calculations, etc., disclosed herein can be utilized or performed by the multidimensional filter processor component to facilitate performing joint adaptations of multiple filter sub-components of a filter component of a transceiver component.

To further illustrate various aspects of the disclosed subject matter, some aspects of the joint convergence problem with an FFF and an echo-cancellation filter can be analyzed. There can be a signal r as given by Equation (Eq.) (1) as follows:

$$r = h*x + a*y + n, \quad (1)$$

where h is the channel, x is the remotely transmitted signal, a is the echo channel, y is the locally transmitted signal, and n denotes the residual noise.

The signal at the slicer can be given by Eq. (2):

$$z = f*r + c*y. \quad (2)$$

where f can denote the FFF response, and c can denote the echo canceller response. The slicer error can be given by Eq. (3):

$$e = z - f[1b]*x, \quad (3)$$

where b can denote a THP filter that can be used for precoding at the transmitter.

In accordance with the disclosed subject matter, the system 100, employing the multidimensional filter processor component 110, can determine an adaptive update for f and c that can efficiently and jointly converge the two filters (e.g., filter sub-components) to minimize the slicer error or at least reduce the slicer error to a defined acceptable threshold level of error, in accordance with the defined filter adaptation criteria.

In some implementations, the multidimensional filter processor component 110 can employ an LMS-type technique to facilitate adapting the filter sub-components (e.g., filter sub-components 106, 108) of the filter component 104. The disclosed subject matter described various aspects relating to performing an LMS analysis and using an LMS-type technique to facilitate determining an inverse correlation structure to facilitate countering cross-correlation between filter inputs of respective filters (e.g., filter sub-components) during filter adaptations.

Based on an LMS technique, the convergence behavior of such a filter (e.g., filter sub-component) can depend in part on the eigenvalue spread of the autocorrelation matrix of the filter input. As such, Eq. (2) for the filter output at some time sample can be rewritten as Eq. (4) as follows:

$$z = [f^T \, c^T] \begin{bmatrix} r \\ y \end{bmatrix}, \quad (4)$$

where, without loss of generality, f and r can be $M_1 \times 1$ vectors and c and y can be $M_2 \times 1$ vectors.

In this way, there can be a single filter that can be given by the vector $$\begin{bmatrix} f \\ c \end{bmatrix}$$

that can operate on the filter input vector $$\begin{bmatrix} r \\ y \end{bmatrix}$$

with the desired filter output given by Eq. (3). The autocorrelation matrix of the filter input can be given by Eqs. (5) through (7) as follows:

$$R = E\begin{bmatrix} r \\ y \end{bmatrix}[r^T \, y^T] \quad (5)$$

$$= \begin{bmatrix} E\{rr^T\} & E\{ry^T\} \\ E\{r^Ty\} & E\{yy^T\} \end{bmatrix} \quad (6)$$

$$= \begin{bmatrix} R_r & R_{r,y} \\ R_{r,y}^* & R_y \end{bmatrix} \quad (7)$$

The transmit data from both ends can be identically and independently distributed (IID) and can be assumed without loss of generality to be of unit variance, and, as a result, $R_y = I_{M_2}$. The autocorrelation sequence of the received channel signal for lag n can be given by Eqs. (8) and (9) as follows:

$$R_r(n) = h(n)*h(-n)*R_x(n) + a(n)*a(-n)*R_y(n) + R_n(n) \quad (8)$$

$$= h(n)*h(-n) + a(n)*a(-n) + \sigma^2 \delta(n), \quad (9)$$

where again it can be noted that the transmit data can be IID with unit power and, as a result, $R_x(n) = R_y(n) = \delta(n)$, and $\sigma^2$ can represent the IID noise variance. The autocorrelation matrix $R_r$ can be formed by forming an $M_1 \times M_1$ Toeplitz matrix based at least in part on the first $M_1$ lags of the autocorrelation sequence $R_r(n)$. Similarly, it can be noted in Eqs. (10) and (11) that $$R_{r,y}(n) = a(n)*R_y(n) \quad (10)$$

$$= a(n). \quad (11)$$

This can represent a desirable characterization of the autocorrelation matrix of the input to an adaptive filter in terms of the channel and echo impulse responses.

Since the filters can be implemented using frequency-domain transformations, it can be instructive to look at the frequency-domain behavior associated with the filters. To facilitate observing the frequency-domain behavior associated with a filter, the behavior for a specific bin k can be analyzed. For this analysis, it can be assumed that the bin behavior is uncorrelated to other bins. This is technically not true because of FFT leakage, however, with the relatively large FFT sizes, the bin behavior can be independent, or at least substantially independent, over a small set of bins. For the analysis, there can be a focus on the FFF and first ECHO slice (e.g., if multiple echo filters are present). For completeness, other ECHO slices and NEXT/FEXT also would be taken into account as well; however, for this analysis the other ECHO slices and NEXT/FEXT can be ignored or disregarded for right now. Bin k of the FFT of the FFF input can be denoted by $X_k$ while the FFT of the echo-filter input can be denoted by $Y_k$, wherein the autocorrelation matrix of the filter inputs of the FFF and the echo filter can be given Eq. (12) as follows:

$$R_k = [H_k X_k + A_k Y_k + N_k] \circledast W, \quad (12)$$

where $\circledast$ can denote the circular convolution operation with the window W, which can represent the time-domain windowing that implicitly can be performed because of the finite FFT size. For purposes of this illustration, ignoring the windowing, the autocorrelation matrix can be given by Eq. (13) as follows:

$$R_k = H_k X_k + A_k Y_k + N_k, \quad (13)$$

The frequency-domain slicer input signal $Z_k$ for bin k can be given by Eq. (14):

$$Z_k = F_k R_k + C_k Y_k. \quad (14)$$

Following the same basic approach as before the situation can be treated as a 2-tap adaptive filter per bin, and so the adaptation can depend on the 2×2 correlation matrix, given by Eqs. (15) through (18) as follows $$T_k = E\begin{bmatrix} R_k \\ Y_k \end{bmatrix} [R_k^T Y_k^T] \quad (15)$$

$$= \begin{bmatrix} E\{R_k R_k^T\} & E\{R_k Y_k^T\} \\ E\{r_k^T Y_k\} & E\{Y_k Y_k^T\} \end{bmatrix} \quad (16)$$

$$= \begin{bmatrix} R_{R_k} & R_{R_k Y_k} \\ R_{R_k,Y_k} & R_{Y_k} \end{bmatrix} \quad (17)$$

$$= \begin{bmatrix} \|H_k\|^2 + \|A_k\|^2 + \sigma^2 & A_k \\ A_k^T & 1 \end{bmatrix} \quad (18)$$

where unity gain FFTs can be assumed.

In terms of the update equations, there can be a filter LMS adaptation or update as follows, for example, by Eq. (19)

$$\begin{bmatrix} F_k' \\ C_k' \end{bmatrix} = \begin{bmatrix} F_k \\ C_k \end{bmatrix} + \begin{bmatrix} \mu_{F_k} & 0 \\ 0 & \mu_{C_k} \end{bmatrix} \begin{bmatrix} R_k \\ Y_k \end{bmatrix} e_k^*, \quad (19)$$

where $\mu_{F_k}$ and $\mu_{C_k}$ can denote the frequency selective mu's for the two tap filter for bin k. One choice (e.g., a common choice) can be to use $$\mu_{F_k} = \frac{\alpha}{\hat{H}_k^2} \quad (20)$$

$$\mu_{C_k} = \beta, \quad (21)$$

where $\hat{H}_k^2$ can denote the estimated through channel frequency response at bin k, although it can be noted that, in some implementations, a general matrix $D_k$ alternatively can be used. Based on Eqs. (20) and (21), Eq. (19) can be rewritten as Eqs. (22) and (23) as follows:

$$\begin{bmatrix} F_k' \\ C_k' \end{bmatrix} = \begin{bmatrix} F_k \\ C_k \end{bmatrix} + \begin{bmatrix} \frac{\alpha}{\hat{H}_k^2} & 0 \\ 0 & \beta \end{bmatrix} \begin{bmatrix} R_k \\ Y_k \end{bmatrix} e_k^* \quad (22)$$

$$= \begin{bmatrix} F_k \\ C_k \end{bmatrix} + D_k \begin{bmatrix} R_k \\ Y_k \end{bmatrix} e_k. \quad (23)$$

By multiplying both sides of the equation by $D_k^{1/2}$, we can transform Eq. (22) into $$\begin{bmatrix} \overline{F}_k' \\ \overline{C}_k' \end{bmatrix} = \begin{bmatrix} \overline{F}_k \\ \overline{C}_k \end{bmatrix} + \begin{bmatrix} \overline{R}_k \\ \overline{Y}_k \end{bmatrix} \overline{e}_k, \quad (24)$$

where $$\begin{bmatrix} \overline{F}_k \\ \overline{C}_k \end{bmatrix} = D_k^{-\frac{1}{2}} \begin{bmatrix} F_k \\ C_k \end{bmatrix} \quad (25)$$

$$\begin{bmatrix} \overline{R}_k \\ \overline{Y}_k \end{bmatrix} = D_k^{\frac{1}{2}} \begin{bmatrix} R_k \\ Y_k \end{bmatrix}. \quad (26)$$

Based on Eq. (25), the LMS performance of Eq. (22) can be similar to an LMS filter with an autocorrelation matrix that can be given by Eq. (27):

$$\bar{T}_k = E\left\{D_k^{\frac{1}{2}}\begin{bmatrix} R_k \\ Y_k \end{bmatrix}\begin{bmatrix} R_k \\ Y_k \end{bmatrix}^T D_k^{\frac{1}{2}}\right\} \quad (27)$$

$$= D_k^{\frac{1}{2}} T_k D_k^{\frac{1}{2}}$$

$$= D_k^{\frac{1}{2}}\begin{bmatrix} \|H_k\|^2 + \|A_k\|^2 + \sigma^2 & A_k \\ A_k^T & 1 \end{bmatrix} D_k^{\frac{1}{2}},$$

To facilitate illustrating aspects of the disclosed subject matter, a few specific scenarios will be examined. One scenario is with regard to an FFF filter and echo filter when no echo is present. Without any echo present, the kth bin autocorrelation matrix becomes $$T_k = \begin{bmatrix} \|H_k\|^2 + \sigma^2 & 0 \\ 0 & 1 \end{bmatrix}. \quad (28)$$

It is clear than that the 2 two eigenvalues are given by $\|H_k\|^2 + \sigma^2$ and 1. Over the entire FFT bins, the minimum eigenvalue can be given by Eq. (29) as $$\lambda_{min} = \min_k [\|H_k\|^2 + \sigma^2], \quad (29)$$

and the condition number over all 2N modes can be given by Eq. (30) as $$\frac{\lambda_{max}}{\lambda_{min}} = \frac{1}{\min_k [\|H_k\|^2 + \sigma^2]}. \quad (30)$$

A $$\frac{1}{PSD(f)}$$

normalization can be equivalent to having $$D_k = \begin{bmatrix} \frac{\mu}{\hat{H}_k^2} & 0 \\ 0 & \mu \end{bmatrix}, \quad (31)$$

and so kth autocorrelation matrix can become $$\bar{T}_k = \begin{bmatrix} \frac{\mu^{0.5}}{H_k} & 0 \\ 0 & \mu^{0.5} \end{bmatrix}\begin{bmatrix} \|H_k\|^2 & 0 \\ 0 & 1 \end{bmatrix}\begin{bmatrix} \frac{\mu^{0.5}}{H_k} & 0 \\ 0 & \mu^{0.5} \end{bmatrix} \quad (32)$$

$$= \begin{bmatrix} \mu + \frac{\mu\sigma^2}{\|H_k\|^2} & 0 \\ 0 & \mu \end{bmatrix}. \quad (33)$$

As can be observed, the eigenvalue spread has significantly decreased with the $$\frac{1}{PSD(f)}$$

normalization.

Another scenario that can be examined is with regard to an FFF filter and echo filter when there is echo and an RX signal present. With echo present, the kth bin autocorrelation matrix can become $$T_k = \begin{bmatrix} \|H_k\|^2 + \|A_k\|^2 + \sigma^2 & A_k \\ A_k^T & 1 \end{bmatrix}. \quad (34)$$

Without frequency-selective μ's, the eigenvalues can be determined using the quadratic formula. Defining $$\phi = \|H_k\|^2 + \|A_k\|^2 + \sigma^2 + 1 \quad (35)$$

$$\varphi = \|H_k\|^2 + \|A_k\|^2 + \sigma^2 - \|A_k\|^2 = \|H_k\|^2 + \sigma^2 \quad (36)$$

the two eigenvalues, $L_1$ and $L_2$, can be given by Eqs. (37) through (42) as follows:

$$L_1 = \frac{\phi}{2} + \left(\frac{\phi^2}{4} - \varphi\right)^{\frac{1}{2}} \quad (37)$$

$$= \frac{\|H_k\|^2 + \|A_k\|^2 + \sigma^2 + 1}{2} + \quad (38)$$

$$\left(\frac{(\|H_k\|^2 + \|A_k\|^2 + \sigma^2 + 1)^2}{4} - \|H_k\|^2 - \sigma^2\right)^{\frac{1}{2}}$$

$$= \frac{\|H_k\|^2 + \|A_k\|^2 + \sigma^2 + 1}{2} + \quad (39)$$

$$\left(\frac{(\|H_k\|^2 + \|A_k\|^2 + \sigma^2 + 1)^2}{4} + \|A_k\|^2\right)^{\frac{1}{2}}$$

$$L_2 = \frac{\phi}{2} - \left(\frac{\phi^2}{4} - \varphi\right)^{\frac{1}{2}} \quad (40)$$

$$= \frac{\|H_k\|^2 + \|A_k\|^2 + \sigma^2 + 1}{2} - \quad (41)$$

$$\left(\frac{(\|H_k\|^2 + \|A_k\|^2 + \sigma^2 + 1)^2}{4} - \|H_k\|^2 - \sigma^2\right)^{\frac{1}{2}}$$

$$= \frac{\|H_k\|^2 + \|A_k\|^2 + \sigma^2 + 1}{2} - \quad (42)$$

$$\left(\frac{(\|H_k\|^2 + \|A_k\|^2 + \sigma^2 - 1)^2}{4} + \|A_k\|^2\right)^{\frac{1}{2}}.$$

An observation that can be made directly from Eq. (34) is that when $\|H_k\|^2$ is much smaller than $\|A_k\|$ the autocorrelation matrix can become very close to singular as the two columns of the matrix are almost scaled versions of each other with a scaling of $A_k^T$.

With a μ selection given by $$D_k = \begin{bmatrix} \mu_k \alpha_k & 0 \\ 0 & \mu_k \beta_k \end{bmatrix}, \quad (43)$$

and the kth autocorrelation matrix can become $$\bar{T}_k = \begin{bmatrix} \mu_k \alpha_k & 0 \\ 0 & \mu_k \beta_k \end{bmatrix}^{0.5}\begin{bmatrix} \|H_k\|^2 + \|A_k\|^2 + \sigma^2 & A_k \\ A_k^T & 1 \end{bmatrix}\begin{bmatrix} \mu_k \alpha_k & 0 \\ 0 & \mu_k \beta_k \end{bmatrix}^{0.5} \quad (44)$$

-continued $$= \begin{bmatrix} \mu_k \alpha_k (\|H_k\|^2 + \|A_k\|^2 + \sigma^2) & \mu_k \alpha_k^{0.5} \beta_k^{0.5} A_k \\ \mu_k \alpha_k^{0.5} \beta_k^{0.5} A_k^T & \mu_k \beta_k \end{bmatrix}$$

As before, defining:

$$\phi = \mu_k \alpha_k (\|H_k\|^2 + \|A_k\|^2 + \sigma^2) + \mu_k \beta_k \quad (45)$$

$$\varphi = \mu_k^2 \alpha_k \beta_k (\|H_k\|^2 + \|A_k\|^2 + \sigma^2) - \mu_k^2 \beta_k \alpha_k \|A_k\|^2 \quad (46)$$

$$= \mu_k^2 \alpha_k \beta_k (\|H_k\|^2 + \|A_k\|^2 + \sigma^2 - \|A_k\|^2), \quad (47)$$

the two eigenvalues, $L_1$ and $L_2$, can be given by Eqs. (48) and (49) as follows:

$$L_1 = \frac{\phi}{2} + \left(\frac{\phi^2}{4} - \varphi\right)^{\frac{1}{2}}, \quad (48)$$

$$L_2 = \frac{\phi}{2} - \left(\frac{\phi^2}{4} - \varphi\right)^{\frac{1}{2}}, \quad (49)$$

In ethernet systems, the channel responses sometimes can have a relatively large variation. Often, the receiver (RX) channel can generally behave like a low-pass frequency channel. The high-frequency channel power attenuation can be as large as 100,000 (or 50 dB) compared to the low-frequency channel power attenuation. Echo channels also can exhibit large variations, but in general the echo response can have more of a high-pass frequency shape. This can be because impedance matching, which can be related to the echo behavior and characteristics, can be better at low frequencies. Active and passive echo reduction or shaping techniques can significantly alter the shape of the echo. Oftentimes, at some frequency bins, the echo response can be much larger than the RX channel response, and the ratio of the echo power to the RX power can be many dBs, and even as bad as 40 dB in some situations.

The $\alpha_k$, $\beta_k$ adaptation constants, which can represent diagonal scaling in the $D_k$ adaptation matrix, can be used to effect the correlation structure dictating the LMS adaptation for bin k. For example, choosing $\mu_k = \alpha_k = \beta_k = 1$ can result in the same condition number as the original correlation matrix and no improvement in the condition number of the correlation matrix. In many situations, this kind of weighing can result in correlation matrices with a very large condition number.

It is noted that the bin condition number can provide only certain information relating to the convergence behavior for the filters. It can be desirable to know the actual eigenvalues, which can ultimately determine the convergence behavior. The actual eigenvalues of the correlation matrices can be determined, for example, using well-known numerical procedures for finding the eigenvalues of correlation matrices.

An example adaptation scheme can be illustrated for $$\mu_k = 1, \alpha_k = \frac{\alpha}{RX - CHAN - PSD}, \beta_k = 1.$$

For this adaptation scheme, the FFF filter inputs are weighed by the inverse of the through channel's power spectrum. Therefore frequency selective μ's are selected only for the FFF filter input, with a bin weighing of $$\alpha_k = \frac{\alpha}{\|H_k\|^2} = \frac{\min_k [\|H_k\|^2]}{\|H_k\|^2}. \quad (50)$$

$$\beta_k = \beta = 1, \quad (51)$$

where α, β are constants meant to insure stable convergence behavior. This choice of frequency-domain μ can still result in very small eigenvalues and therefore will suffer from relatively slow convergence. It is noted that the choice of the echo filter adaptation constant can make a significant difference on the eigenvalue distribution, and the eigenvalue distribution can be significantly improved as further disclosed herein.

Still another example adaptation scheme can be illustrated for $$\mu_k = 1, \alpha_k = \frac{\alpha}{RX - CHAN - PSD}, \beta_k = \text{'optimal'},$$

wherein 'optimal' can represent the optimal $\beta_k$. For this example adaptation scheme, the FFF filter inputs are weighed by the inverse of the through channel's power spectrum while the echo filter input μ is chosen optimally. Therefore frequency selective μ's are selected only for the FFF filter input, with a bin weighing of $$\alpha_k = \frac{\alpha}{\|H_k\|^2} = \frac{\min_k [\|H_k\|^2]}{\|H_k\|^2}. \quad (52)$$

$$\beta_k = \beta = \min_\beta \frac{\lambda_{max}(k)}{\lambda_{min}(k)} \quad (53)$$

By empirically sweeping the β value and examining the resulting condition number, the β that results in the minimal eigenvalue spread can be determined.

Based on observed empirical data, an optimal constant $\beta_k$ can significantly reduce the maximum condition number significantly. Implemented accordingly, the convergence time with the optimal adaptation scheme can be improved, for example, by a factor of approximately 3. In some embodiments, the echo power can be reduced before the FFF filter, which can lead to a significantly faster convergence with a proper choice of adaptation constants.

Other aspects of the disclosed subject matter can relate to improving or optimizing LMS bin weighing. If the adaptation process is limited to only controlling the FFF and ECHO stepsizes without the ability for combining cross-terms, the adaptation process may be effectively limited to an LMS stepsize control matrix that can be diagonal. Based at least in part on aspects relating to some of the example adaptation schemes (e.g., as described herein connection with FIGS. 7-19), as disclosed herein, it can be derived or observed that some of the most challenging eigenvalue distributions can occur at relatively high frequencies. Proceeding along the same lines as that with regard to the example adaptation schemes, as disclosed herein, the disclosed subject matter can be employed to facilitate improving or optimizing the echo cancellation $\beta_k$ jointly with the FFF μ to facilitate achieving the lowest bin condition number or at least a significantly improved lower bin condition number that can satisfy a defined threshold level, in accordance with the defined filter adaptation criteria.

Further aspects relating to use of a general stepsize matrix to facilitate joint convergence of filters during adaptation are disclosed. For optimal convergence results the restriction that the LMS stepsize control for the 2-tap frequency-domain filter for bin k be diagonal can be removed, and a general 2×2 matrix stepsize control can be considered. Based on the results described with regard to when there is echo and an RX signal present an FFF filter and echo filter (e.g., in connection with Eqs. 34 through 50) and Eq. (27), the optimal stepsize matrix for bin k can be given as $$D = T_k^{-1} = \begin{bmatrix} \|H_k\|^2 + \|A_k\|^2 + \sigma^2 & A_k \\ A_k^T & 1 \end{bmatrix}^{-1}. \tag{54}$$

The inverse of the 2×2 autocorrelation matrix can be calculated using the formula $$D = T_k^{-1} \tag{55}$$

$$D = T_k^{-1} \tag{55}$$

$$= \frac{1}{\det(T_k)} \begin{bmatrix} 1 & -A_k \\ -A_k^T & \|H_k\|^2 + \|A_k\|^2 + \sigma^2 \end{bmatrix} \tag{56}$$

$$= \frac{1}{\|H_k\|^2 + \sigma^2} \begin{bmatrix} 1 & -A_k \\ -A_k^T & \|H_k\|^2 + \|A_k\|^2 + \sigma^2 \end{bmatrix} \tag{57}$$

An alternative approach can be where the autocorrelation matrix (e.g., cross-correlation matrix) is first converted to an Hermitian-Symmetric matrix by first multiplying the matrix $$S_k = \begin{bmatrix} \frac{1}{\|H_k\|^2 + \|A_k\|^2 + \sigma^2} & 0 \\ 0 & 1 \end{bmatrix} \tag{58}$$

to convert the autocorrelation matrix to $$T_k' = \begin{bmatrix} 1 & \frac{A_k}{(\|H_k\|^2 + \|A_k\|^2 + \sigma^2)^{0.5}} \\ \frac{A_k^T}{(\|H_k\|^2 + \|A_k\|^2 + \sigma^2)^{0.5}} & 1 \end{bmatrix} \tag{59}$$

Such a matrix can have the eigenvector decomposition given by $$T_k' \tag{60}$$

$$T_k' = \begin{bmatrix} 1 & \frac{A_k}{(\|H_k\|^2 + \|A_k\|^2 + \sigma^2)^{0.5}} \\ \frac{A_k^T}{(\|H_k\|^2 + \|A_k\|^2 + \sigma^2)^{0.5}} & 1 \end{bmatrix} \tag{60}$$

$$= Q_k \Lambda_k Q_k^T \tag{61}$$

$$= \begin{bmatrix} e^{j\angle A_k} & 1 \\ 1 & -e^{-j\angle A_k} \end{bmatrix}^T$$

-continued $$\begin{bmatrix} 1 + \frac{\|A_k\|}{(\|H_k\|^2 + \|A_k\|^2 + \sigma^2)^{0.5}} & 0 \\ 0 & 1 - \frac{\|A_k\|}{(\|H_k\|^2 + \|A_k\|^2 + \sigma^2)^{0.5}} \end{bmatrix}$$

$$\begin{bmatrix} e^{j\angle A_k} & 1 \\ 1 & -e^{-j\angle A_k} \end{bmatrix},$$

The inverse matrix (e.g., the inverse correlation matrix) can be given by $$T_k'^{-1} = Q_k^T \Lambda_k^{-T} Q_k \tag{62}$$

$$= \begin{bmatrix} e^{j\angle A_k} & 1 \\ 1 & -e^{-j\angle A_k} \end{bmatrix}^T \begin{bmatrix} \left[1 + \frac{\|A_k\|}{\delta}\right]^{-1} & 0 \\ 0 & \left[1 - \frac{\|A_k\|}{\delta}\right]^{-1} \end{bmatrix}$$

$$\begin{bmatrix} e^{j\angle A_k} & 1 \\ 1 & -e^{-j\angle A_k} \end{bmatrix},$$

with $\delta = (\|H_k\|^2 + \|A_k\|^2 + \sigma^2)^{0.5}$.

In this way, the inverse correlation matrix can be expressed as 3 matrices (e.g., as shown with regard to Equation (62)), which can be applied by the multidimensional filter processor component to facilitate jointly adapting filter sub-components.

Example Computing Environment

Figure 8:
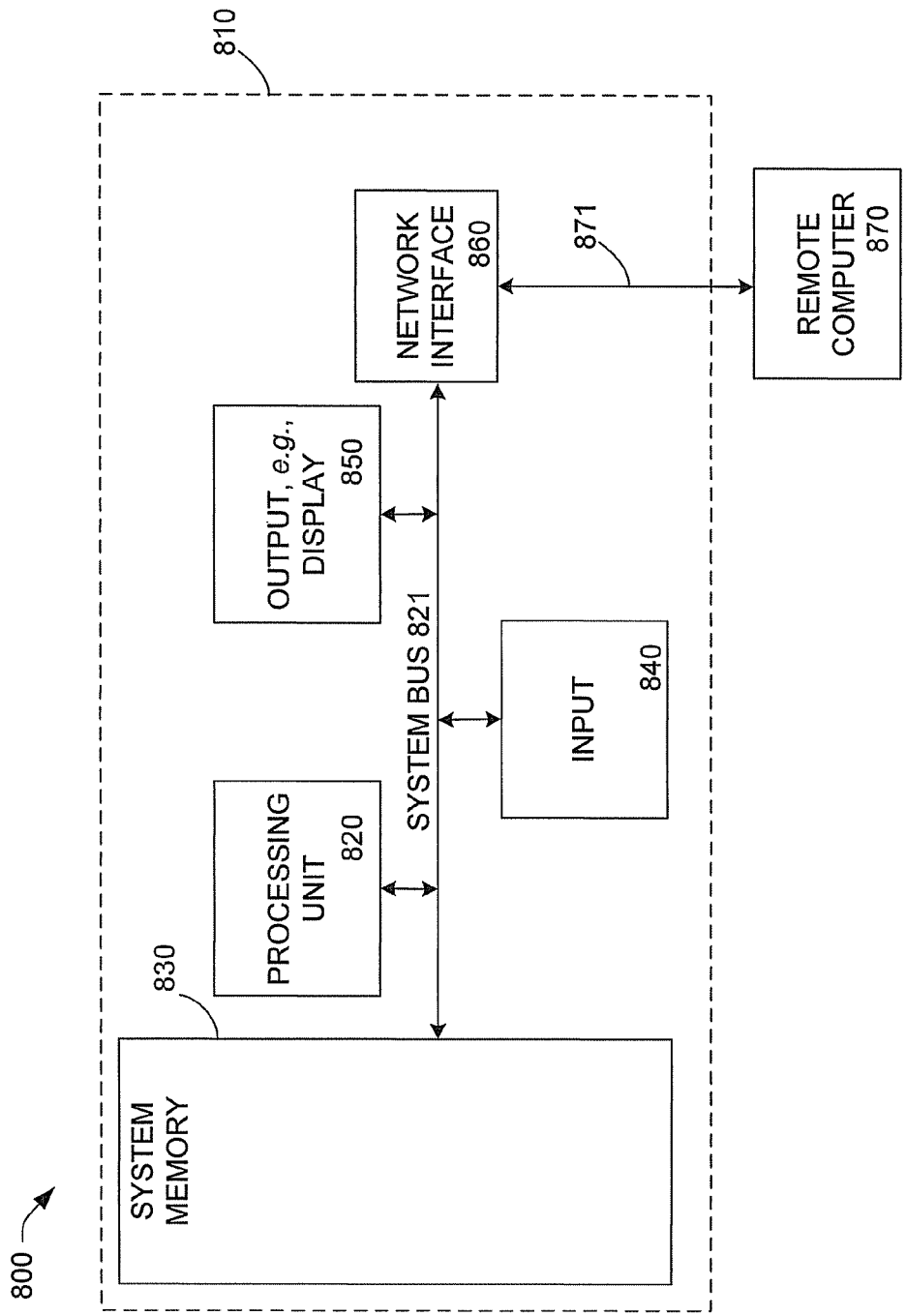
FIG. 8 illustrates a block diagram of an example electronic computing environment that can be implemented in conjunction with one or more aspects described herein.

As mentioned, advantageously, the techniques described herein can be applied to any device and/or network where filter adaptation of multiple filters (e.g., filter sub-components) is desirable in a system comprising a transceiver component. It is to be understood, therefore, that handheld, portable and other computing devices and computing objects of all kinds are contemplated for use in connection with the various non-limiting embodiments, e.g., anywhere that it can be desirable for a device to implement filter adaptation of multiple filters (e.g., filter sub-components) associated with a system comprising a transceiver component. Accordingly, the below general purpose remote computer described below in FIG. 8 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 8 thus illustrates an example of a suitable computing system environment 800 in which some aspects of the disclosed subject matter can be implemented, although as made clear above, the computing system environment 800 is only one example of a suitable computing environment for a device and is not intended to suggest any limitation as to the scope of use or functionality of the disclosed subject matter. Neither should the computing environment 800 be interpreted as having any dependency or requirement relating to any one or combination of components illustrated in the exemplary operating environment 800.

With reference to FIG. 8, an exemplary device for implementing the disclosed subject matter includes a general-purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures.

Computer 810 typically includes a variety of computer readable media. Computer readable media can be any available media that can be accessed by computer 810. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 810. Communication media typically embodies computer readable instructions, data structures, program modules, or other data in a modulated data signal such as a carrier wave or other transport mechanism and includes any information delivery media.

The system memory 830 may include computer storage media in the form of volatile and/or nonvolatile memory such as read only memory (ROM) and/or random access memory (RAM). A basic input/output system (BIOS), containing the basic routines that help to transfer information between elements within computer 810, such as during start-up, may be stored in memory 830. Memory 830 typically also contains data and/or program modules that are immediately accessible to and/or presently being operated on by processing unit 820. By way of example, and not limitation, memory 830 may also include an operating system, application programs, other program modules, and program data.

The computer 810 may also include other removable/non-removable, volatile/nonvolatile computer storage media. For example, computer 810 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 821 through a non-removable memory interface such as an interface, and a magnetic disk drive or optical disk drive is typically connected to the system bus 821 by a removable memory interface, such as an interface.

A user can enter commands and information into the computer 810 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 820 through user input 840 and associated interface(s) that are coupled to the system bus 821, but may be connected by other interface and bus structures, such as a parallel port, game port, or a universal serial bus (USB). A graphics subsystem can also be connected to the system bus 821. A projection unit in a projection display device, or a HUD in a viewing device or other type of display device can also be connected to the system bus 821 via an interface, such as output interface 850, which may in turn communicate with video memory. In addition to a monitor, computers can also include other peripheral output devices such as speakers which can be connected through output interface 850.

The computer 810 can operate in a networked or distributed environment using logical connections to one or more other remote computer(s), such as remote computer 870, which can in turn have media capabilities different from device 810. The remote computer 870 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 810. The logical connections depicted in FIG. 8 include a network 871, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 810 can be connected to the LAN 871 through a network interface or adapter. When used in a WAN networking environment, the computer 810 can typically include a communications component, such as a modem, or other means for establishing communications over the WAN, such as the Internet. A communications component, such as wireless communications component, a modem and so on, which can be internal or external, can be connected to the system bus 821 via the user input interface of input 840, or other appropriate mechanism. In a networked environment, program modules depicted relative to the computer 810, or portions thereof, can be stored in a remote memory storage device. It will be appreciated that the network connections shown and described are exemplary and other means of establishing a communications link between the computers can be used.

Example Networking Environment

Figure 9:
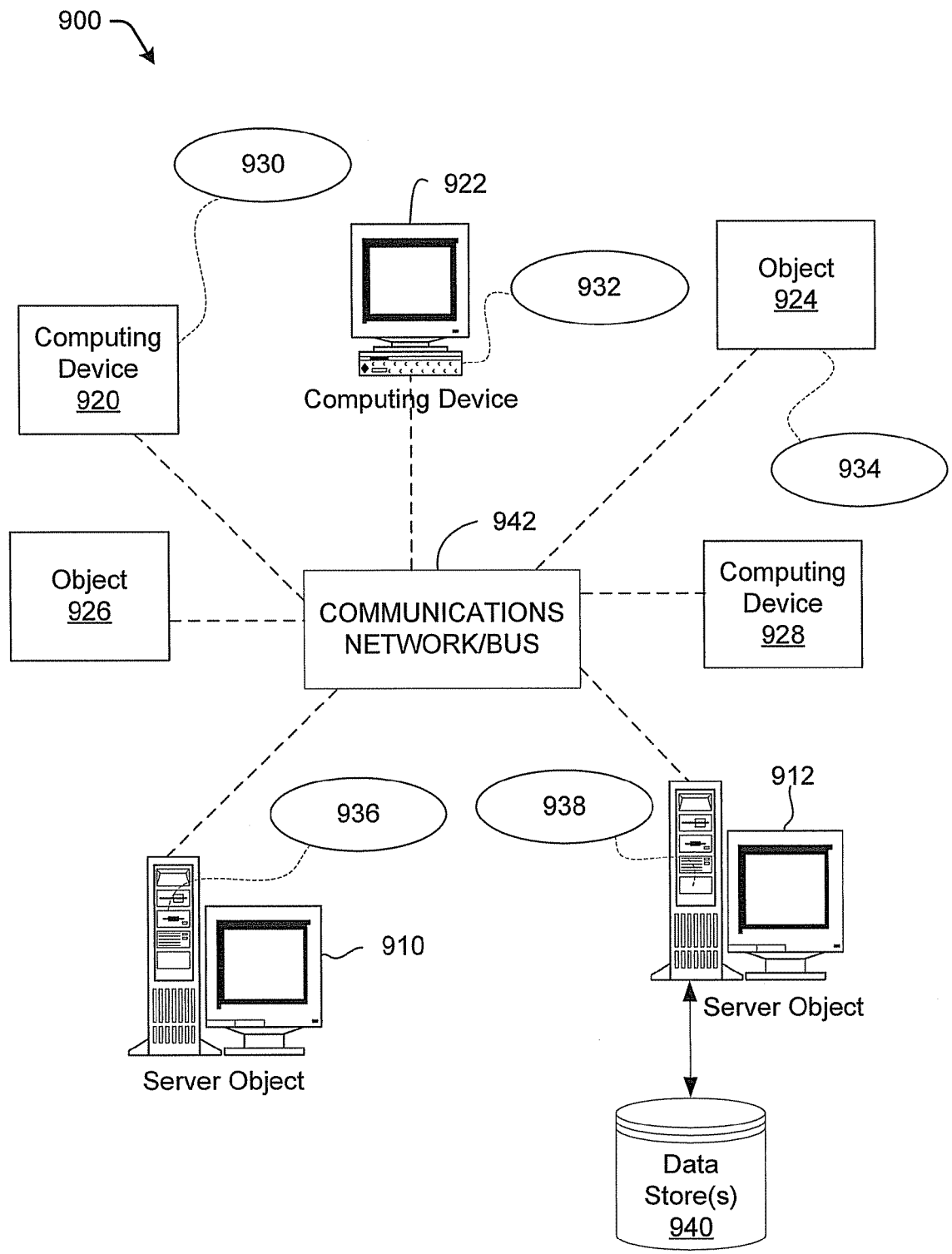
FIG. 9 illustrates a block diagram of an example data communication network that can be operable in conjunction with various aspects described herein.

FIG. 9 provides a schematic diagram of an exemplary networked or distributed computing environment 900. The distributed computing environment comprises computing objects 910, 912, etc. and computing objects or devices 920, 922, 924, 926, 928, etc., which may include programs, methods, data stores, programmable logic, etc., as represented by applications 930, 932, 934, 936, 938 and data store(s) 940. It can be appreciated that computing objects 910, 912, etc. and computing objects or devices 920, 922, 924, 926, 928, etc.

may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 940 can include one or more cache memories, one or more registers, or other similar data stores disclosed herein.

Each computing object 910, 912, etc. and computing objects or devices 920, 922, 924, 926, 928, etc. can communicate with one or more other computing objects 910, 912, etc. and computing objects or devices 920, 922, 924, 926, 928, etc. by way of the communications network 942, either directly or indirectly. Even though illustrated as a single element in FIG. 9, communications network 942 may comprise other computing objects and computing devices that provide services to the system of FIG. 9, and/or may represent multiple interconnected networks, which are not shown. Each computing object 910, 912, etc. or computing object or devices 920, 922, 924, 926, 928, etc. can also contain an application, such as applications 930, 932, 934, 936, 938, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 9, as a non-limiting example, computing objects or devices 920, 922, 924, 926, 928, etc. can be thought of as clients and computing objects 910, 912, etc. can be thought of as servers where computing objects 910, 912, etc., acting as servers provide data services, such as receiving data from client computing objects or devices 920, 922, 924, 926, 928, etc., storing of data, processing of data, transmitting data to client computing objects or devices 920, 922, 924, 926, 928, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 942 or bus is the Internet, for example, the computing objects 910, 912, etc. can be Web servers with which other computing objects or devices 920, 922, 924, 926, 928, etc. communicate via any of a number of known protocols, such as the hypertext transfer protocol (HTTP). Computing objects 910, 912, etc. acting as servers may also serve as clients, e.g., computing objects or devices 920, 922, 924, 926, 928, etc., as may be characteristic of a distributed computing environment.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methodologies for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system, comprising:
   a first filter component and a second filter component for filtering signals associated with a communication component; and
   a filter processor component for determining a cross-coupled correlation structure associated with a cross-correlation between respective inputs of the first filter component and the second filter component, and for determining an inverse cross-coupled correlation structure that corresponds to an inverse of the cross-coupled correlation structure to facilitate joint adaptation of the first filter component and the second filter component, wherein the filter processor component determines the inverse cross-coupled correlation structure comprising:
   a first inverse cross-coupled correlation sub-structure based at least in part on a first cross-coupled correlation sub-structure associated with a first first-filter frequency sub-channel,
   a second inverse cross-coupled correlation sub-structure based at least in part on a second cross-coupled correlation sub-structure associated with a second first-filter frequency sub-channel,
   a third inverse cross-coupled correlation sub-structure based at least in part on a third cross-coupled correlation sub-structure associated with a first second-filter frequency sub-channel, and
   a fourth inverse cross-coupled correlation sub-structure based at least in part on a fourth cross-coupled correlation sub-structure associated with a second second-filter frequency sub-channel.

2. The system of claim 1, wherein the filter processor component applies the inverse cross-coupled correlation structure to the first filter component and the second filter component to facilitate the joint adaptation of the first filter component and the second filter component.

3. The system of claim 1, wherein the filter processor component determines the cross-correlation between the respective inputs of the first filter component and the second filter component, and generates the cross-coupled correlation structure based at least in part on the cross-correlation.

4. The system of claim 3, wherein the cross-coupled correlation structure comprises a multidimensional cross-coupled correlation matrix.

5. The system of claim 1, wherein the filter processor component determines a first channel response of a first filter input of the first filter component and a second channel response of a second filter input of the second filter component, and determines or estimates the cross-coupled correlation structure based at least in part on the first channel response and the second channel response.

6. The system of claim 1, wherein the filter processor component determines the inverse cross-coupled correlation structure based at least in part on the cross-coupled correlation structure, and generates the inverse cross-coupled correlation structure to facilitate counteracting the cross-correlation between the respective inputs of the first filter component and the second filter component.

7. The system of claim 6, wherein, to facilitate the counteracting of the cross-correlation, the filter processor component facilitates the joint adaptation of the first filter component and the second filter component based at least in part on the inverse cross-coupled correlation structure.

8. The system of claim 6, wherein the inverse cross-coupled correlation structure comprises a multidimensional inverse cross-coupled correlation matrix.

9. The system of claim 1, wherein the filter processor component monitors conditions associated with the communication component and detects whether a filter-adaptation condition has occurred based at least in part on information relating to the conditions, wherein the filter-adaptation condition indicates a filter adaptation is to be performed on at least one of the first filter component or the second filter component.

10. The system of claim 9, wherein the conditions comprise at least one of communication conditions associated with the communication component or an operation being performed by the communication component.

11. The system of claim 9, wherein the filter processor component determines or estimates the cross-coupled correlation structure based at least in part on the information relating to the conditions and a set of properties associated with the communication component or a communication cable associated with the communication component.

12. The system of claim 11, wherein the information relating to the conditions comprises information relating to characteristics of a communication channel associated with the communication component, channel loss associated with the communication channel, a bit error rate associated with the communication channel, or an amount of change in the conditions over a defined period of time, and the set of properties comprises information relating to a cable type of the communication cable, a material of which the communication cable is formed, a manufacturer of the communication cable, or a configuration of the communication component.

13. The system of claim 11, wherein a portion of the information relating to the conditions or a portion of the set of properties is stored in a look-up table that is stored in a data store, and wherein the filter processor component receives the portion of the information relating to the conditions or the portion of the set of properties from the look-up table, and determines or estimates the cross-coupled correlation structure based at least in part on the portion of the information relating to the conditions or the portion of the set of properties.

14. The system of claim 1, wherein the filter processor component jointly adapts the first filter component and the second the component in a frequency domain, and wherein the first filter component comprises a first set of frequency sub-channels and the second filter component comprises a second set of frequency sub-channels.

15. The system of claim 14, wherein the first set of frequency sub-channels comprises the first first-filter frequency sub-channel and the second first-filter frequency sub-channel, and the second set of frequency sub-channels comprises the first second-filter frequency sub-channel and the second second-filter frequency sub-channel.

16. The system of claim 15, wherein the first set of frequency sub-channels further comprises a third first-filter frequency sub-channel, and wherein the filter processor component determines the inverse cross-coupled correlation structure comprising the first inverse cross-coupled correlation sub-structure based at least in part on the first cross-coupled correlation sub-structure associated with the first first-filter frequency sub-channel and the second first-filter frequency sub-channel, and the second inverse cross-coupled correlation sub-structure based at least in part on the second cross-coupled correlation sub-structure associated with the third first-filter frequency sub-channel, wherein the first first-filter frequency sub-channel and the second first-filter frequency sub-channel share a set of characteristics that are different from a set of characteristics associated with the third first-filter frequency sub-channel.

17. The system of claim 15, wherein the filter processor component applies the inverse cross-coupled correlation structure to the first filter component to facilitate application of a same inverse cross-coupled correlation to the first first-filter frequency sub-channel and the second first-filter frequency sub-channel.

18. The system of claim 15, wherein the filter processor component applies the inverse cross-coupled correlation structure to the first first-filter frequency sub-channel, and does not apply the inverse cross-coupled correlation structure to the second first-filter frequency sub-channel, in response to determining that the first first-filter frequency sub-channel satisfies a defined threshold for adaptation relating to a defined unacceptably slow convergence level and the second first-filter frequency sub-channel does not satisfy the defined threshold for adaptation.

19. The system of claim 15, wherein the filter processor component determines a subset of the inverse cross-coupled correlation structure to apply to the first set of frequency sub-channels and the second set of frequency sub-channels, and applies the subset of the inverse cross-coupled correlation structure to the first set of frequency sub-channels and the second set of frequency sub-channels to facilitate jointly adapting the first filter component and the second filter component.

20. The system of claim 15, wherein the filter processor component determines an initial inverse cross-coupled correlation structure, and determines the inverse cross-coupled correlation structure that is an approximation of the initial inverse cross-coupled correlation structure, wherein the filter processor component is able to apply the inverse cross-coupled correlation structure to facilitate the joint adaptation of the first filter component and the second filter component using a lower amount of resources than the initial inverse cross-coupled correlation structure.

21. The system of claim 1, wherein the filter processor component adapts, in parallel, the first first-filter frequency sub-channel based at least in part on the first inverse cross-coupled correlation sub-structure, the second first-filter frequency sub-channel based at least in part on the second inverse cross-coupled correlation sub-structure, the first second-filter frequency sub-channel based at least in part on the third inverse cross-coupled correlation sub-structure, and the second second-filter frequency sub-channel based at least in part on the fourth inverse cross-coupled correlation sub-structure.

22. The system of claim 1, wherein the filter processor component determines or generates the inverse cross-coupled correlation structure based at least in part on at least one of a least-mean-square adaptation algorithm, a normalized least-mean-square algorithm, an affine projection least-mean-square algorithm, a recursive-least-squares adaptation algorithm, a blind adaptation algorithm, an iterative filter adaptation algorithm, a parametric model, or a non-parametric model.

23. The system of claim 1, wherein, to facilitate determining the cross-coupled correlation structure or determining the inverse cross-coupled correlation structure, the filter processor component determines or estimates the cross-coupled correlation structure or the inverse cross-coupled correlation structure in a frequency domain or a time domain.

24. The system of claim 1, wherein the filter processor component modifies iterative filter updates of the first filter component or the second filter component based at least in part on information relating to the cross-coupled correlation structure.

25. The system of claim 1, wherein the filter processor component performs a transformation of a filter input of the first filter component based at least in part on information relating to the cross-coupled correlation structure.

26. A method, comprising:
determining a cross-coupled correlation structure associated with a cross-correlation between respective inputs of a first filter and a second filter associated with a communication device; and
determining an inverse cross-coupled correlation structure corresponding to an inverse of the cross-coupled correlation structure to facilitate jointly adapting the first filter and the second filter based at least in part on the inverse cross-coupled correlation structure, wherein the determining the inverse cross-coupled correlation structure comprises:
determining a first inverse cross-coupled correlation sub-structure based at least in part on a first cross-coupled correlation sub-structure associated with a first first-filter frequency sub-channel,
determining a second inverse cross-coupled correlation sub-structure based at least in part on a second cross-coupled correlation sub-structure associated with a second first-filter frequency sub-channel,
determining a third inverse cross-coupled correlation sub-structure based at least in part on a third cross-coupled correlation sub-structure associated with a first second-filter frequency sub-channel, and
determining a fourth inverse cross-coupled correlation sub-structure based at least in part on a fourth cross-coupled correlation sub-structure associated with a second second-filter frequency sub-channel.

27. The method of claim 26, further comprising:
determining the cross-correlation between the respective inputs of the first filter and the second filter associated with the communication device;
generating the cross-coupled correlation structure based at least in part on the cross-correlation;
determining the inverse cross-coupled correlation structure based at least in part on the cross-coupled correlation structure; and
generating the inverse cross-coupled correlation structure to facilitate counteracting the cross-correlation between the respective inputs of the first filter and the second filter.

28. The method of claim 26, further comprising:
monitoring conditions associated with the communication device; and
detecting whether a filter-adaptation condition has occurred based at least in part on information relating to the conditions, wherein the filter-adaptation condition indicates that a filter adaptation is to be performed on the first filter and the second filter.

29. The method of claim 28, further comprising:
in response to detecting the filter-adaptation condition, determining the cross-coupled correlation structure based at least in part on the information relating to the conditions and a set of properties associated with the communication device or a communication cable associated with the communication device.

30. The method of claim 26, wherein the first filter comprises a first set of frequency sub-channels and the second filter comprises a second set of frequency sub-channels, the first set of frequency sub-channels comprises the first first-filter frequency sub-channel and the second first-filter frequency sub-channel, and the second set of frequency sub-channels comprises the first second-filter frequency sub-channel and the second second-filter frequency sub-channel.

31. The method of claim 26, further comprising:
storing, in a data store, a portion of information relating to conditions associated with the communication device or a portion of a set of properties associated with the communication device or a communication cable associated with the communication device;
receiving the portion of the information relating to the conditions or the portion of the set of properties from the data store; and
determining the cross-coupled correlation structure based at least in part on the portion of the information relating to the conditions or the portion of the set of properties.

32. The method of claim 26, further comprising:
jointly adapting the first first-filter frequency sub-channel based at least in part on the first inverse cross-coupled correlation sub-structure, the second first-filter frequency sub-channel based at least in part on the second inverse cross-coupled correlation sub-structure, the first second-filter frequency sub-channel based at least in part on the third inverse cross-coupled correlation sub-structure, and the second second-filter frequency sub-channel based at least in part on the fourth inverse cross-coupled correlation sub-structure.

33. A system, comprising:
means for determining a cross-coupled correlation structure associated with a cross-correlation between respective inputs of a first means for filtering and a second means for filtering associated with a transceiver component based at least in part on conditions associated with the first means for filtering and the second means for filtering; and
means for determining an inverse cross-coupled correlation structure, based at least in part on an inverse of the cross-coupled correlation structure between the respective inputs of the first means for filtering and the second means for filtering, to facilitate jointly adapting the first means for filtering and the second means for filtering using the inverse cross-coupled correlation structure, wherein the means for determining the inverse cross-coupled correlation structure determines:

a first inverse cross-coupled correlation sub-structure based at least in part on a first cross-coupled correlation sub-structure associated with a first first-filter frequency sub-channel,
a second inverse cross-coupled correlation sub-structure based at least in part on a second cross-coupled correlation sub-structure associated with a second first-filter frequency sub-channel,
a third inverse cross-coupled correlation sub-structure based at least in part on a third cross-coupled correlation sub-structure associated with a first second-filter frequency sub-channel, and
a fourth inverse cross-coupled correlation sub-structure based at least in part on a fourth cross-coupled correlation sub-structure associated with a second second-filter frequency sub-channel.

34. The system of claim 33, further comprising:
means for jointly adapting the first first-filter frequency sub-channel based at least in part on the first inverse cross-coupled correlation sub-structure, the second first-filter frequency sub-channel based at least in part on the second inverse cross-coupled correlation sub-structure, the first second-filter frequency sub-channel based at least in part on the third inverse cross-coupled correlation sub-structure, and the second second-filter frequency sub-channel based at least in part on the fourth inverse cross-coupled correlation sub-structure.

* * * * *